(12) United States Patent
Devine et al.

(10) Patent No.: US 9,246,463 B2
(45) Date of Patent: Jan. 26, 2016

(54) COMPENSATION NETWORKS AND COMMUNICATION CONNECTORS USING SAID COMPENSATION NETWORKS

(71) Applicant: Panduit Corp., Tinley Park, IL (US)

(72) Inventors: Louann M. Devine, Des Plaines, IL (US); Paul W. Wachtel, Arlington Heights, IL (US); Masud Bolouri-Saransar, Orland Park, IL (US); Vytas J. Vaitkus, Orland Park, IL (US); Teresa Agee, Park Forest, IL (US); Ronald A. Nordin, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 136 days.

(21) Appl. No.: 14/198,291

(22) Filed: Mar. 5, 2014

(65) Prior Publication Data

US 2014/0256182 A1    Sep. 11, 2014

Related U.S. Application Data

(60) Provisional application No. 61/774,225, filed on Mar. 7, 2013.

(51) Int. Cl.
| | | |
|---|---|---|
| H01R 24/00 | (2011.01) | |
| H03H 7/01 | (2006.01) | |
| H03H 7/42 | (2006.01) | |
| H01R 13/6466 | (2011.01) | |
| H01R 13/66 | (2006.01) | |
| H01R 24/64 | (2011.01) | |
| H04B 3/32 | (2006.01) | |
| H03H 7/38 | (2006.01) | |
| H05K 1/02 | (2006.01) | |

(52) U.S. Cl.
CPC .......... *H03H 7/0115* (2013.01); *H01R 13/6466* (2013.01); *H01R 13/6658* (2013.01); *H01R 24/64* (2013.01); *H03H 7/427* (2013.01); *H04B 3/32* (2013.01); *H03H 7/0123* (2013.01); *H03H 7/383* (2013.01); *H05K 1/0228* (2013.01); *H05K 1/0239* (2013.01); *H05K 2201/10189* (2013.01)

(58) Field of Classification Search
CPC ............................ H01R 23/025; H01R 23/005
USPC ........... 439/676, 941, 620.11, 620.17, 620.23
See application file for complete search history.

(56) References Cited

U.S. PATENT DOCUMENTS

| | | |
|---|---|---|
| 5,295,869 A | 3/1994 | Siemon et al. |
| 5,299,956 A | 4/1994 | Brownell et al. |
| 5,310,363 A | 5/1994 | Brownell et al. |
| 5,362,257 A | 11/1994 | Neal et al. |

(Continued)

FOREIGN PATENT DOCUMENTS

| | | |
|---|---|---|
| WO | 2004047240 A2 | 6/2004 |
| WO | 2010019785 A1 | 2/2010 |
| WO | 2010065588 A1 | 6/2010 |

*Primary Examiner* — Phuongchi T Nguyen
(74) *Attorney, Agent, or Firm* — Christopher S. Clancy; Yuri Astvatsaturov

(57) ABSTRACT

The present invention generally relates to the field of network communication, and more specifically to networks for crosstalk reduction/compensation and communication connectors which employ such networks. In some embodiments, the present invention employs an orthogonal network implemented within a communication jack to compensate for crosstalk which occurs within a communication plug and at the plug/jack interface.

19 Claims, 26 Drawing Sheets

(56) References Cited

U.S. PATENT DOCUMENTS

| | | | |
|---|---|---|---|
| 5,432,484 | A | 7/1995 | Klas et al. |
| 5,459,643 | A | 10/1995 | Siemon et al. |
| 5,470,244 | A | 11/1995 | Lim et al. |
| 5,474,474 | A | 12/1995 | Siemon et al. |
| 5,547,405 | A | 8/1996 | Pinney et al. |
| 5,586,914 | A | 12/1996 | Foster, Jr. et al. |
| 5,626,497 | A | 5/1997 | Bouchan et al. |
| 5,673,009 | A | 9/1997 | Klas et al. |
| 5,700,167 | A | 12/1997 | Pharney et al. |
| 5,791,943 | A | 8/1998 | Lo et al. |
| 5,938,479 | A | 8/1999 | Paulson et al. |
| 5,997,358 | A | 12/1999 | Adriaenssens et al. |
| 6,023,200 | A | 2/2000 | Rhee |
| 6,089,923 | A | 7/2000 | Phommachanh |
| 6,099,357 | A | 8/2000 | Reichle |
| 6,168,474 | B1 | 1/2001 | German et al. |
| 6,176,742 | B1 | 1/2001 | Arnett et al. |
| 6,186,834 | B1 | 2/2001 | Arnett et al. |
| 6,196,880 | B1 | 3/2001 | Goodrich et al. |
| 6,231,397 | B1 | 5/2001 | De La Borbolla et al. |
| 6,270,381 | B1 | 8/2001 | Adriaenssens et al. |
| 6,283,795 | B1 | 9/2001 | Chen |
| 6,356,162 | B1 | 3/2002 | DeFlandre et al. |
| 6,379,157 | B1 | 4/2002 | Curry et al. |
| 6,435,918 | B1 | 8/2002 | Chen |
| 6,443,776 | B2 | 9/2002 | Reichle |
| 6,464,529 | B1 | 10/2002 | Jensen et al. |
| 6,464,541 | B1 | 10/2002 | Hashim et al. |
| 6,526,807 | B1 * | 3/2003 | Doumit .................. G01M 3/04 340/605 |
| 6,533,618 | B1 | 3/2003 | Aekins |
| 6,612,880 | B2 | 9/2003 | Arnett et al. |
| 6,866,548 | B2 | 3/2005 | Hashim |
| 6,916,209 | B1 | 7/2005 | Casher et al. |
| 6,964,587 | B2 | 11/2005 | Colantuono et al. |
| 7,038,554 | B2 | 5/2006 | Seefried |
| 7,048,590 | B2 | 5/2006 | Colantuono et al. |
| 7,052,328 | B2 | 5/2006 | Ciezak et al. |
| 7,057,899 | B2 | 6/2006 | AbuGhazaleh et al. |
| 7,086,909 | B2 | 8/2006 | Colantuono et al. |
| 7,140,924 | B2 | 11/2006 | Redfield et al. |
| 7,153,168 | B2 | 12/2006 | Caveney et al. |
| 7,154,049 | B2 | 12/2006 | Celella et al. |
| 7,166,000 | B2 | 1/2007 | Pharney |
| 7,168,993 | B1 | 1/2007 | Hashim |
| 7,175,476 | B2 | 2/2007 | Kim et al. |
| 7,176,383 | B2 | 2/2007 | Lauffer et al. |
| 7,179,131 | B2 | 2/2007 | Caveney et al. |
| 7,182,649 | B2 | 2/2007 | Caveney et al. |
| 7,190,594 | B2 | 3/2007 | Hashim et al. |
| 7,201,618 | B2 | 4/2007 | Ellis et al. |
| 7,204,722 | B2 | 4/2007 | Hashim et al. |
| 7,252,554 | B2 | 8/2007 | Caveney et al. |
| 7,265,300 | B2 | 9/2007 | Adriaenssens et al. |
| 7,281,957 | B2 | 10/2007 | Caveney |
| 7,294,025 | B1 | 11/2007 | Chen |
| 7,301,780 | B2 | 11/2007 | AbuGhazaleh et al. |
| 7,309,261 | B2 | 12/2007 | Caveney et al. |
| 7,314,393 | B2 | 1/2008 | Hashim |
| 7,320,624 | B2 | 1/2008 | Hashim et al. |
| 7,364,470 | B2 | 4/2008 | Hashim |
| 7,367,849 | B2 | 5/2008 | Wang et al. |
| 7,381,098 | B2 | 6/2008 | Hammond, Jr. et al. |
| 7,384,315 | B2 | 6/2008 | Caveney et al. |
| 7,402,085 | B2 | 7/2008 | Hammond, Jr. et al. |
| 7,427,218 | B1 | 9/2008 | Hashim et al. |
| 7,442,092 | B2 | 10/2008 | Caveney et al. |
| 7,452,246 | B2 | 11/2008 | Caveney et al. |
| 7,481,681 | B2 | 1/2009 | Caveney et al. |
| 7,485,010 | B2 | 2/2009 | Aekins |
| 7,500,883 | B2 | 3/2009 | Ciezak et al. |
| 7,520,784 | B2 | 4/2009 | Caveney et al. |
| 7,537,484 | B2 | 5/2009 | Reeves et al. |
| 7,591,686 | B2 | 9/2009 | Ellis et al. |
| 7,591,689 | B2 | 9/2009 | Caveney et al. |
| 7,618,296 | B2 | 11/2009 | Caveney |
| 7,677,930 | B2 | 3/2010 | Hashim et al. |
| 7,677,931 | B2 | 3/2010 | Aekins |
| 7,682,203 | B1 | 3/2010 | Pharney et al. |
| 7,686,650 | B2 | 3/2010 | Belopolsky et al. |
| 7,726,018 | B2 | 6/2010 | Caveney et al. |
| 7,787,615 | B2 | 8/2010 | Hammond, Jr. et al. |
| 7,823,281 | B2 | 11/2010 | Caveney et al. |
| 7,824,231 | B2 | 11/2010 | Marti et al. |
| 7,841,909 | B2 | 11/2010 | Murray et al. |
| 7,850,492 | B1 | 12/2010 | Straka et al. |
| 7,854,632 | B2 | 12/2010 | Reeves et al. |
| 7,874,878 | B2 | 1/2011 | Fite et al. |
| 7,874,879 | B2 | 1/2011 | Caveney et al. |
| 7,892,040 | B2 | 2/2011 | Ellis et al. |
| 7,909,656 | B1 | 3/2011 | Erickson et al. |
| 7,914,345 | B2 | 3/2011 | Bopp et al. |
| 7,914,346 | B2 | 3/2011 | Pharney et al. |
| 7,927,153 | B2 | 4/2011 | Straka et al. |
| 7,955,139 | B2 | 6/2011 | Straka et al. |
| 7,967,645 | B2 | 6/2011 | Marti et al. |
| 7,976,348 | B2 | 7/2011 | Aekins et al. |
| 7,976,349 | B2 | 7/2011 | Heckmann |
| 7,980,900 | B2 | 7/2011 | Hashim et al. |
| 7,985,103 | B2 | 7/2011 | Straka et al. |
| 8,002,571 | B2 | 8/2011 | Hogue et al. |
| 8,007,311 | B2 | 8/2011 | Hogue et al. |
| 8,011,972 | B2 | 9/2011 | Caveney et al. |
| 8,016,621 | B2 | 9/2011 | Bopp et al. |
| 8,038,482 | B2 | 10/2011 | Erickson et al. |
| 8,047,879 | B2 | 11/2011 | Hashim |
| 8,052,483 | B1 | 11/2011 | Straka et al. |
| 8,128,437 | B2 | 3/2012 | Straka et al. |
| 8,403,709 | B2 | 3/2013 | Hammond, Jr. et al. |
| 2007/0238366 | A1 | 10/2007 | Hammond, Jr. et al. |
| 2008/0268710 | A1 | 10/2008 | Hashim et al. |
| 2010/0041274 | A1 * | 2/2010 | Marti .................. H01R 3/6658 439/607.01 |
| 2010/0048040 | A1 | 2/2010 | Straka et al. |
| 2010/0167589 | A1 | 7/2010 | Hammond, Jr. et al. |
| 2010/0190357 | A1 * | 7/2010 | Hashim .............. H01R 13/6658 439/55 |
| 2010/0317230 | A1 | 12/2010 | Larsen et al. |
| 2011/0086549 | A1 | 4/2011 | Caveney et al. |
| 2011/0122767 | A1 | 5/2011 | Dent |
| 2011/0318970 | A1 | 12/2011 | Hammond, Jr. et al. |
| 2012/0003874 | A1 | 1/2012 | Reeves et al. |
| 2013/0130560 | A1 | 5/2013 | Bolouri-Saransar et al. |

* cited by examiner

COMPENSATION NETWORKS AND COMMUNICATION CONNECTORS USING SAID COMPENSATION NETWORKS

CROSS-REFERENCE TO RELATED APPLICATIONS

This application claims the benefit of U.S. Provisional Patent Application No. 61/774,225, filed on Mar. 7, 2013, which is incorporated herein by reference in its entirety.

FIELD OF INVENTION

The present invention generally relates to the field of network communication, and more specifically to networks for crosstalk reduction/compensation and communication connectors which employ such networks.

BACKGROUND

The evolution of computing has witnessed a significant shift in the importance of networks. An ever-increasing quantity of information is constantly being gathered, stored, and shared among a wide range of users. In addition to the sheer growth of data, users have come to expect quicker access to this information. This combination of size and speed has created a need for network infrastructure capable of supporting a high data rate.

Current networks readily employ jacks and plugs, and other communication connectors. These connectors typically include closely spaced parallel conductors which allow the jack and the plug to interface to each other. Conventional communication connectors have been used in relatively low data rate applications with relatively few problems. However, as transmission frequency and data rates increase, crosstalk (particularly near-end crosstalk (NEXT)) due to capacitive and inductive couplings among the closely spaced parallel conductors within the jack and/or plug has become increasingly problematic.

Therefore, it is desirable to have communication connectors capable of achieving improved performance.

SUMMARY

Accordingly, embodiments of the present invention are directed to communication connectors and/or internal components thereof.

In one embodiment, the present invention is a communication connector that includes plug interface contacts having a plurality of conductor pairs, cable connector contacts, and circuitry connecting the plug interface contacts to respective cable connector contacts. The circuitry has signal lines between respective plug interface contacts and respective cable connector contacts. The signal lines have a plurality of signal pairs and the circuitry includes a network with a first combined mutually inductive and capacitive coupling between a first conductor of a first signal pair and a first conductor of a second the signal pair. The network further includes a second combined mutually inductive and capacitive coupling between a second conductor of the first signal pair and the first conductor of the second signal pair. A shunt capacitive coupling connects the first conductor of the first signal pair and the second conductor of the first signal pair.

In another embodiment, the present invention is a communication system that includes communication equipment and a communication connector connected to the communication equipment. The communication connector includes plug interface contacts having a plurality of conductor pairs, cable connector contacts, and circuitry connecting the plug interface contacts to respective cable connector contacts. The circuitry has signal lines between respective plug interface contacts and respective cable connector contacts. The signal lines have a plurality of signal pairs and the circuitry includes a network with a first combined mutually inductive and capacitive coupling between a first conductor of a first signal pair and a first conductor of a second the signal pair. The network further includes a second combined mutually inductive and capacitive coupling between a second conductor of the first signal pair and the first conductor of the second signal pair. A shunt capacitive coupling connects the first conductor of the first signal pair and the second conductor of the first signal pair.

In yet another embodiment, the present invention is a method of compensating for noise in a communication connector that includes a plurality of signal pairs. The method includes the steps of: reactively crosstalk coupling a first conductor of a first signal pair and a first conductor of a second signal pair; reactively compensation coupling a second conductor of the first signal pair and the first conductor of the second signal pair; and controlling a magnitude of an orthogonal vector by adjusting the crosstalk coupling and the compensation coupling.

In still yet another embodiment, the present invention is a communication connector that includes plug interface contacts, cable connector contacts, and circuitry connecting the plug interface contacts to respective the cable connector contacts. The circuitry includes signal conductors between respective the plug interface contacts and respective the cable connector contacts, the signal conductors include a first signal pair and a second signal pair, the circuitry includes a network with a first combined mutually inductive and capacitive coupling between a first conductor of the first signal pair and a first conductor of the second signal pair, the network further includes a second combined mutually inductive and capacitive coupling between a second conductor of the first signal pair and the first conductor of the second signal pair, and a shunt capacitive coupling connecting the first conductor of the first signal pair and the second conductor of the first signal pair. In a variation of this embodiment, this communication connector is used in a communication system.

In yet another embodiment, the present invention is a method of compensating for noise in a communication connector including a first signal pair and a second signal pair, the method includes the steps of: (1) reactively crosstalk coupling a first conductor of the first signal pair and a first conductor of the second signal pair, the crosstalk coupling having a first orthogonal component; (2) reactively compensation coupling a second conductor of the first signal pair and the first conductor of the second signal pair, the compensation coupling having a second orthogonal component; and (3) controlling a magnitude of an orthogonal vector representing a combination of the first and second orthogonal components by adjusting the crosstalk coupling and the compensation coupling.

These and other features, aspects, and advantages of the present invention will become better-understood with reference to the following drawings, description, and any claims that may follow.

DETAILED DESCRIPTION

Figure 1A:
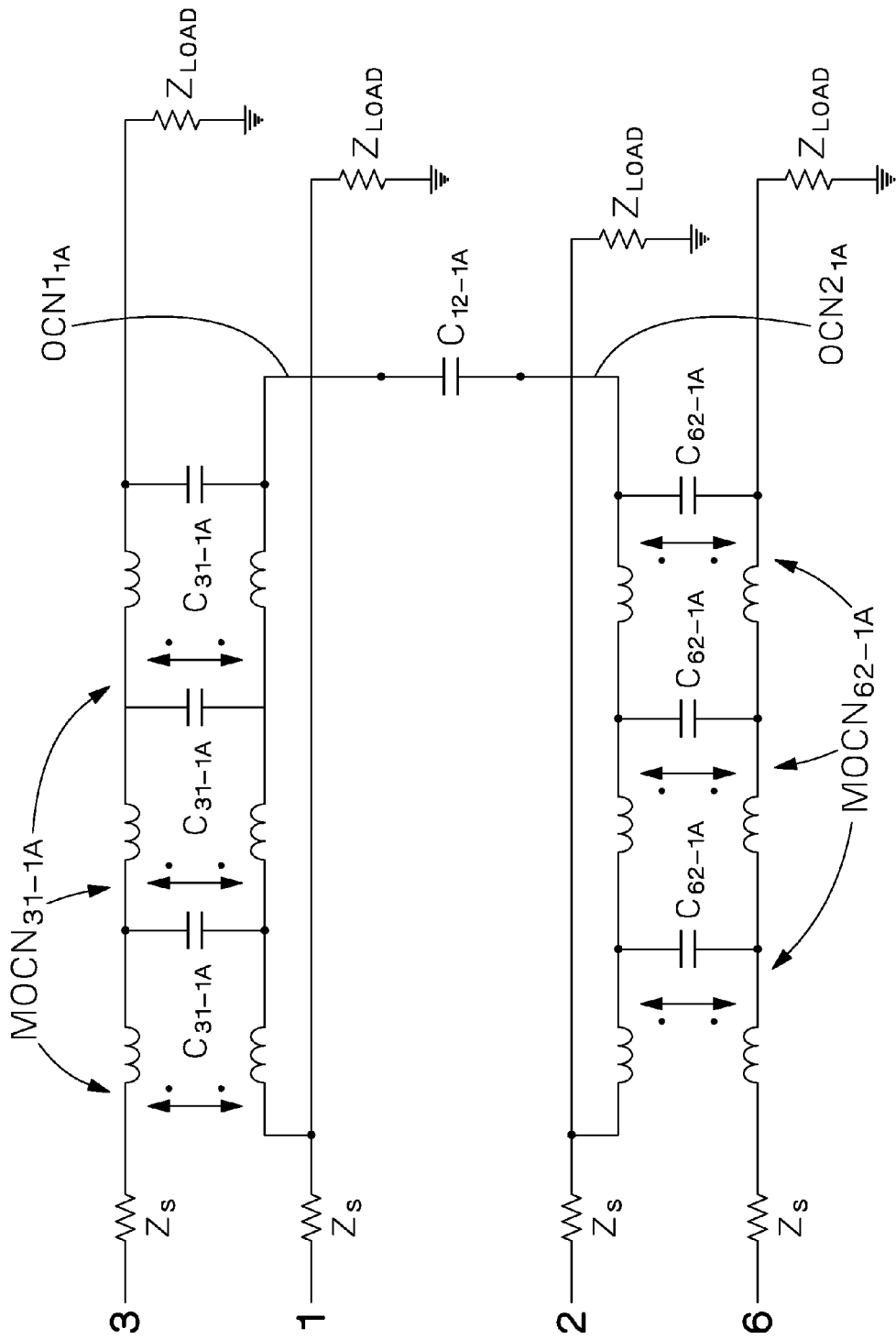
FIG. 1A illustrates a type 1 orthogonal network producing a net compensation signal according to an embodiment of the present invention.

As used herein, "opposite polarity" can be defined as being approximately 180 degrees out of phase in relation to a referenced polarity, and "orthogonal" can be defined as being approximately 90 degrees out of phase in relation to a referenced polarity. Also, as used herein, references to "shunting" can be defined as direct or indirect coupling of two conductors of the same differential pair via some means. For example, a shunting capacitive coupling on a wire pair (e.g., 3:6 wire pair) can refer to some form of a capacitive coupling (e.g., pad capacitor) positioned between a first conductor (e.g., conductor 3) and second conductor (e.g., conductor 6) of that wire pair. Note that indirect coupling may include intervening components such as offshoot traces. Conversely, "non-shunting" can be defined as direct or indirect coupling of two conductors of different differential pairs via some means. Furthermore, "conductor(s)," "signal conductor(s)," and "signal trace(s)" may be used interchangeably and shall be understood to refer to the same feature.

In RJ45 plug/jack connector combinations, NEXT generally occurs between the neighboring conductors of differential pairs. For example, in an RJ45 plug/jack connector combination which has the plug conductors laid out in accordance with ANSI/TIA-568-C.2, NEXT can exist between conductor pairs 1:2 and 3:6, conductor pairs 3:6 and 4:5, and conductor pairs 3:6 and 7:8. In case of conductor pairs 1:2 and 3:6, NEXT can occur due to the coupling which can primarily exist between conductors 2 and 3; in case of conductor pairs 3:6 and 4:5, NEXT can occur due to the coupling which can primarily exist between conductors 3 and 4, and/or conductors 5 and 6; and in case of conductor pairs 3:6 and 7:8, NEXT can occur due to the coupling which can primarily exist between conductors 6 and 7.

The following exemplary embodiments illustrate how the present invention attempts to reduce or otherwise compensate for the crosstalk which may appear between differential pairs of a communication plug/jack combination. The present invention may rely in part on the principles of crosstalk compensation disclosed in U.S. patent application Ser. No. 13/681,480, filed on Nov. 20, 2012, entitled "COMPENSATION NETWORK USING AN ORTHOGONAL COMPENSATION NETWORK," and incorporated herein by reference in its entirety. While at least some of the embodiments are described with reference to conductor pairs 1:2 and 3:6 of a RJ45 plug/jack connector combination having plug contacts laid out in accordance with ANSI/TIA-568-C.2, it should be understood that the same principles of crosstalk compensation can be applied to other differential pairs of such a plug/jack combination (e.g., conductor pairs 3:6 and 4:5, and conductor pairs 3:6 and 7:8) or to other connectors which employ differential pair transmission. Furthermore, the $Z_S$ and $Z_{LOAD}$ in the various embodiments refer to the source impedance and load impedance, respectively.

FIG. 1A illustrates an exemplary embodiment of an orthogonal network. This network may be referred to as a type 1 orthogonal network, and may be implemented inside of a communication jack (e.g., on a printed circuit board (PCB)) by way of discrete elements, distributed couplings, or any combinations thereof. The network of FIG. 1 is illustrated with reference to the 1:2 and 3:6 conductor pairs and achieves the desired compensation between said pairs through inductive and capacitive couplings. In particular, the desired coupling between pair 1:2 and pair 3:6 is achieved through the inductive ($MOCN_{31\text{-}1A}$) and capacitive ($C_{31\text{-}1A}$) couplings between conductor 3 and an offshoot trace $OCN1_{1A}$ of conductor 1, and the inductive ($MOCN_{62\text{-}1A}$) and capacitive ($C_{62-1A}$) couplings between conductor 6 and an offshoot trace $OCN2_{1A}$ of conductor 2. The orthogonal network is enabled with a capacitive coupling $C_{12-1A}$ (e.g., a discrete capacitor) positioned between the offshoot traces $OCN1_{1A}$ and $OCN2_{1A}$. The net resultant signal produced by this network would typically be considered a compensation signal.

Figure 1B:
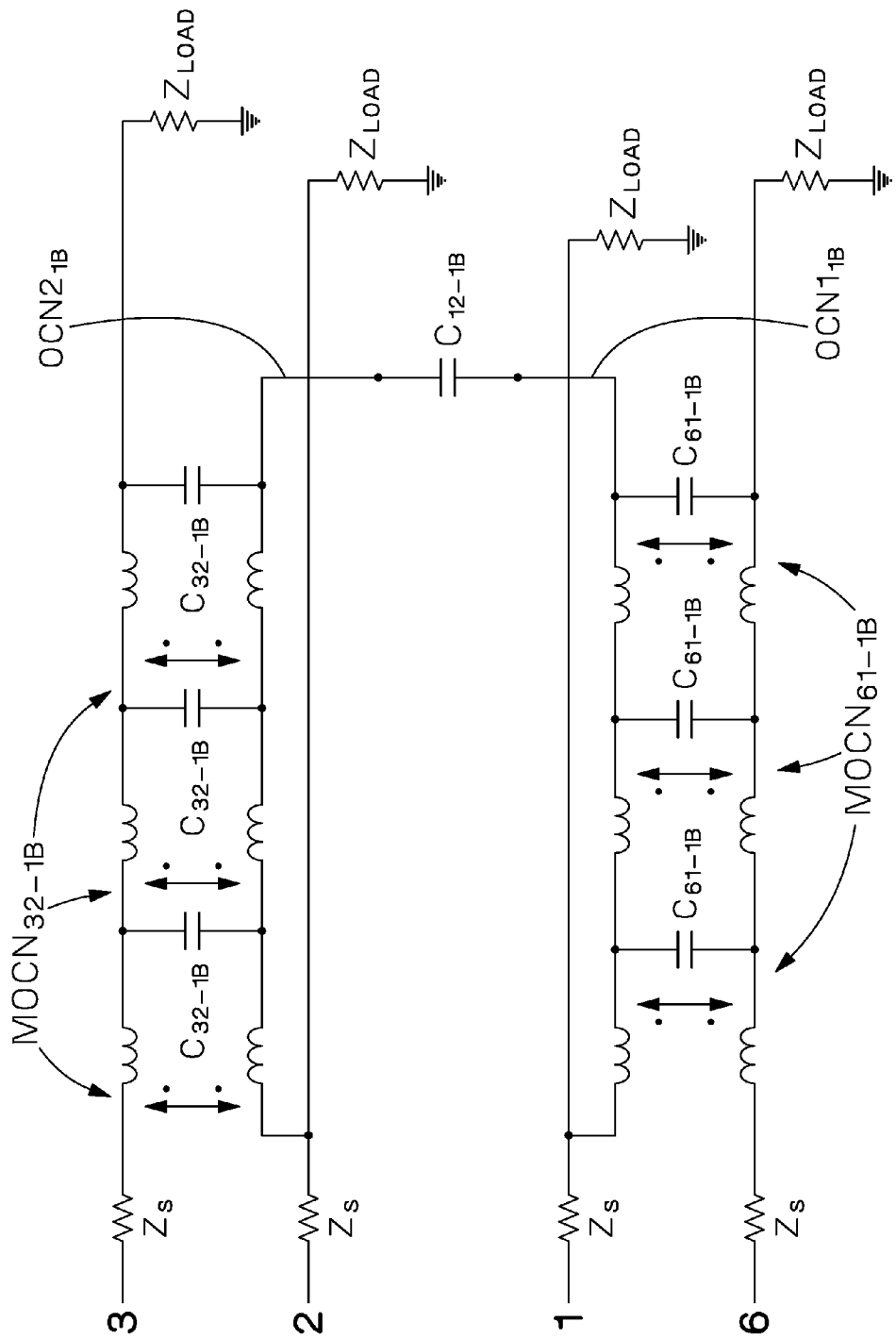
FIG. 1B illustrates a type 1 orthogonal network producing a net crosstalk signal according to an embodiment of the present invention.

FIG. 1B illustrates how the orthogonal network of FIG. 1A can be implemented to provide a net resultant crosstalk signal. As explained further in the specification, such a crosstalk signal may be beneficial in attaining a desired level of overall compensation within a communication jack. The desired coupling between pair 1:2 and pair 3:6 is achieved through the inductive ($MOCN_{32-1B}$) and capacitive ($C_{32-1B}$) couplings between conductor 3 and an offshoot trace $OCN2_{1B}$ of conductor 2, and the inductive ($MOCN_{61-1B}$) and capacitive ($C_{61-1B}$) couplings between conductor 6 and an offshoot trace $OCN1_{1B}$ of conductor 1. The orthogonal network is enabled with a capacitive coupling $C_{12-1B}$ (e.g., a discrete capacitor) positioned between the offshoot traces $OCN1_{1B}$ and $OCN2_{1B}$.

Figure 2A:
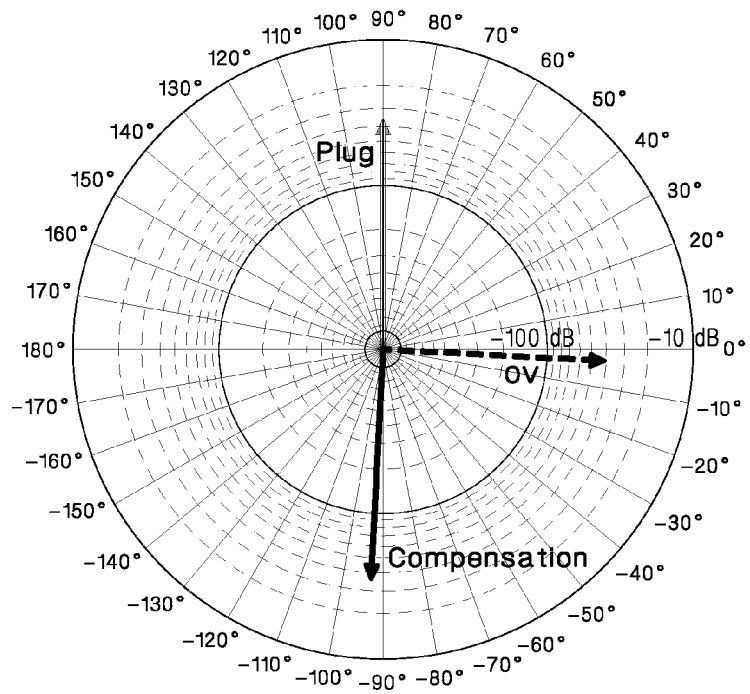
FIG. 2A illustrates a polar plot representative of the orthogonal network of FIG. 1A.
Figure 2B:
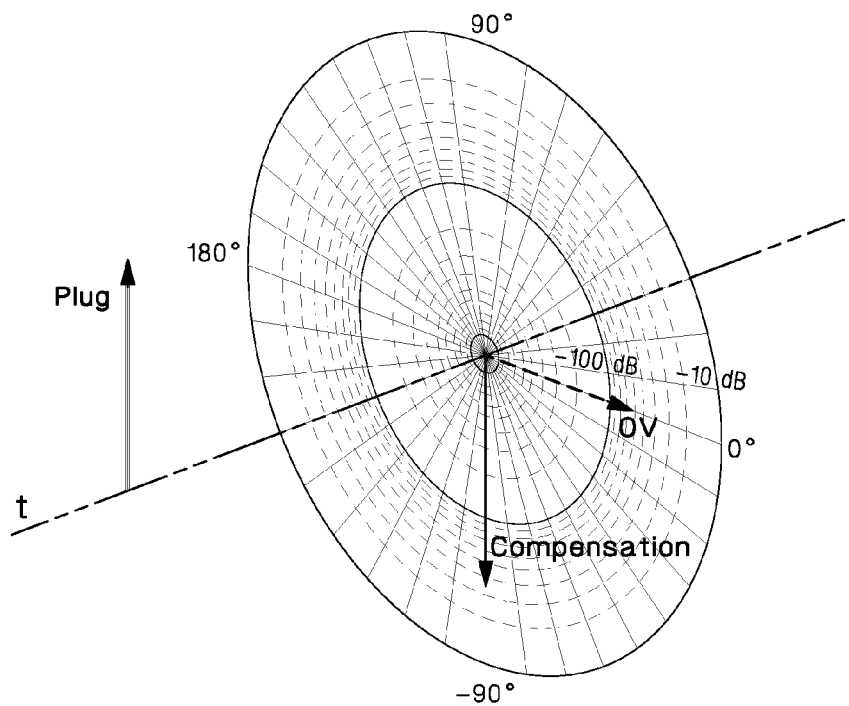
FIG. 2B illustrates signals shown in the polar plot of FIG. 2A on a time scale.
Figure 2C:
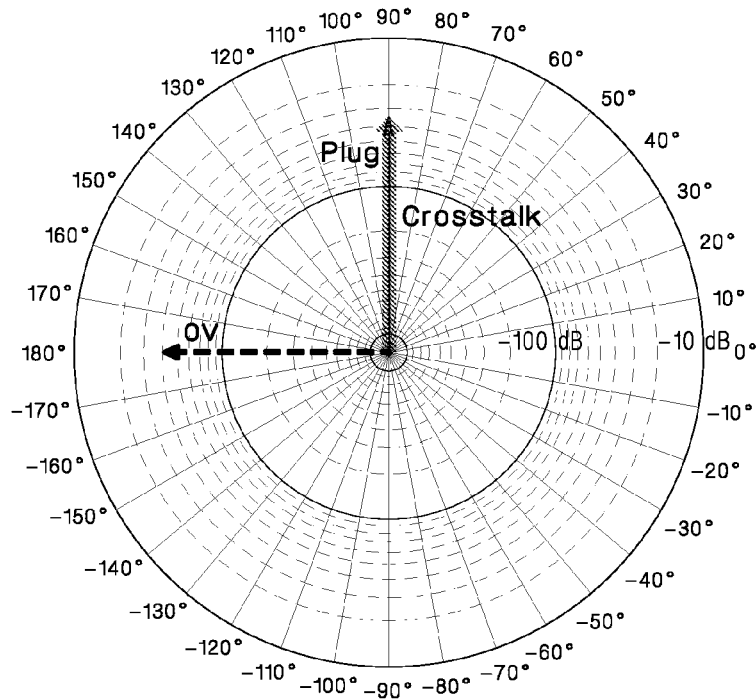
FIG. 2C illustrates a polar plot representative of the orthogonal network of FIG. 1B.
Figure 2D:
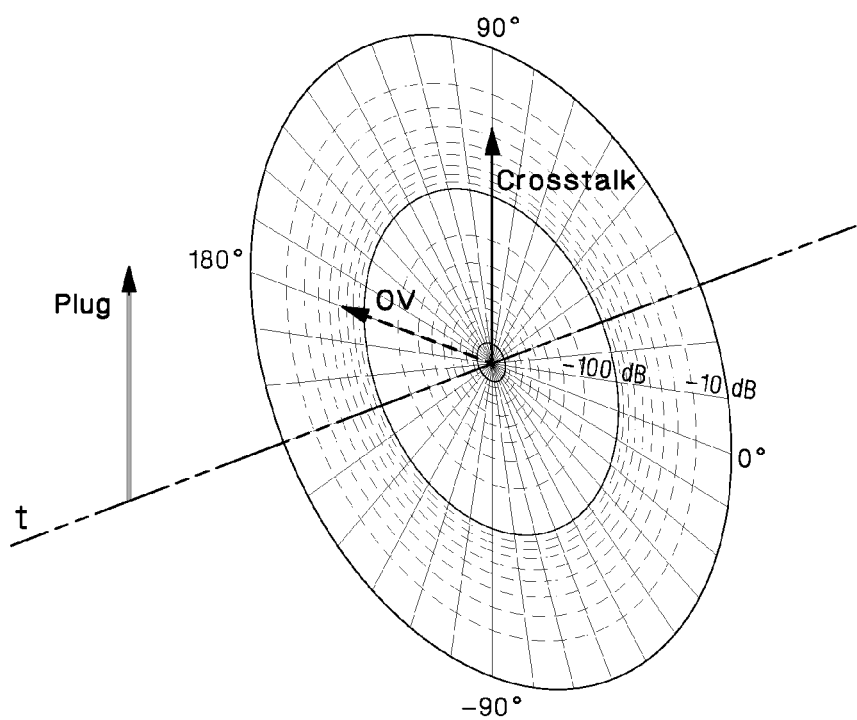
FIG. 2D illustrates signals shown in the polar plot of FIG. 2C on a time scale.

FIGS. 2A and 2C illustrate polar plots representative of the networks of FIGS. 1A and 1B, respectively. The signals produced by both networks of FIGS. 1A and 1B are also shown on a time plots in FIGS. 2B and 2D, respectively. With respect to FIGS. 2A and 2B, the crosstalk produced in the plug is represented by the "Plug" vector with a phase of approximately 90 degrees. The signal produced by the orthogonal network of FIG. 1A is represented by the "Compensation" vector with a phase of approximately −90 degrees and the orthogonal "OV" vector with a phase of approximately 0 degrees. With respect to FIGS. 2C and 2D, the crosstalk produced in the plug is represented by the "Plug" vector (illustrated by the dotted vector in FIG. 2C) with a phase of approximately 90 degrees, and the signal produced by the orthogonal network of FIG. 1B is represented by the "Crosstalk" vector (illustrated by the solid gray shaded vector in FIG. 2C) with a phase of approximately 90 degrees and the orthogonal "OV" vector with a phase of approximately 180 degrees. In both cases, the orthogonal vector "OV" is rotated approximately 90 degrees counterclockwise from the "Compensation"/"Crosstalk" vector of the orthogonal network. The +90 degree phase shift of the "OV" vector relative to the "Compensation"/"Crosstalk" vector as disclosed in U.S. patent application Ser. No. 13/681,480 (previously mentioned) is a characteristic of a type 1 orthogonal network.

Figure 3A:
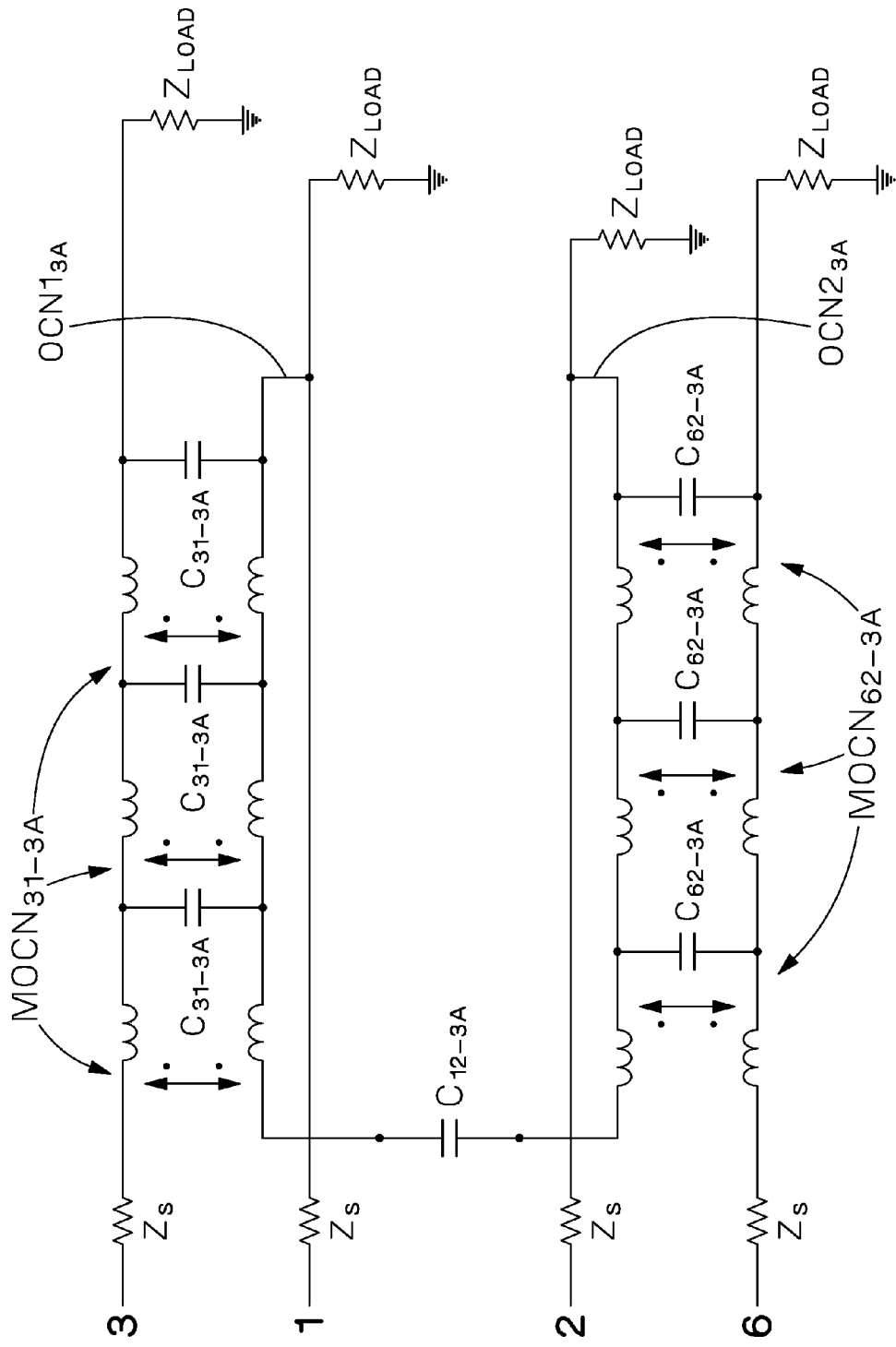
FIG. 3A illustrates a type 2 orthogonal network producing a net compensation signal according to an embodiment of the present invention.

FIG. 3A illustrates another exemplary embodiment of an orthogonal network. This network may be referred to as a type 2 orthogonal network and may be implemented inside of a communication jack (e.g., on a PCB) by way of discrete elements, distributed couplings, or any combinations thereof. The network of FIG. 3A is illustrated with reference to the 1:2 and 3:6 conductor pairs and achieves the desired compensation between said pairs through inductive and capacitive couplings. In particular, the desired compensation between the pair 1:2 and pair 3:6 is achieved through the inductive ($MOCN_{31-3A}$) and capacitive ($C_{31-3A}$) couplings between conductor 3 and an offshoot trace $OCN1_{3A}$ of conductor 1, and the inductive ($MOCN_{62-3A}$) and capacitive ($C_{62-3A}$) couplings between conductor 6 and an offshoot trace $OCN2_{3A}$ of conductor 2. The orthogonal network is enabled with a capacitive coupling $C_{12-3A}$ (e.g., a discrete capacitor) positioned between the offshoot traces $OCN1_{3A}$ and $OCN2_{3A}$. The net resultant signal produced by this network would typically be considered a compensation signal.

Figure 3B:
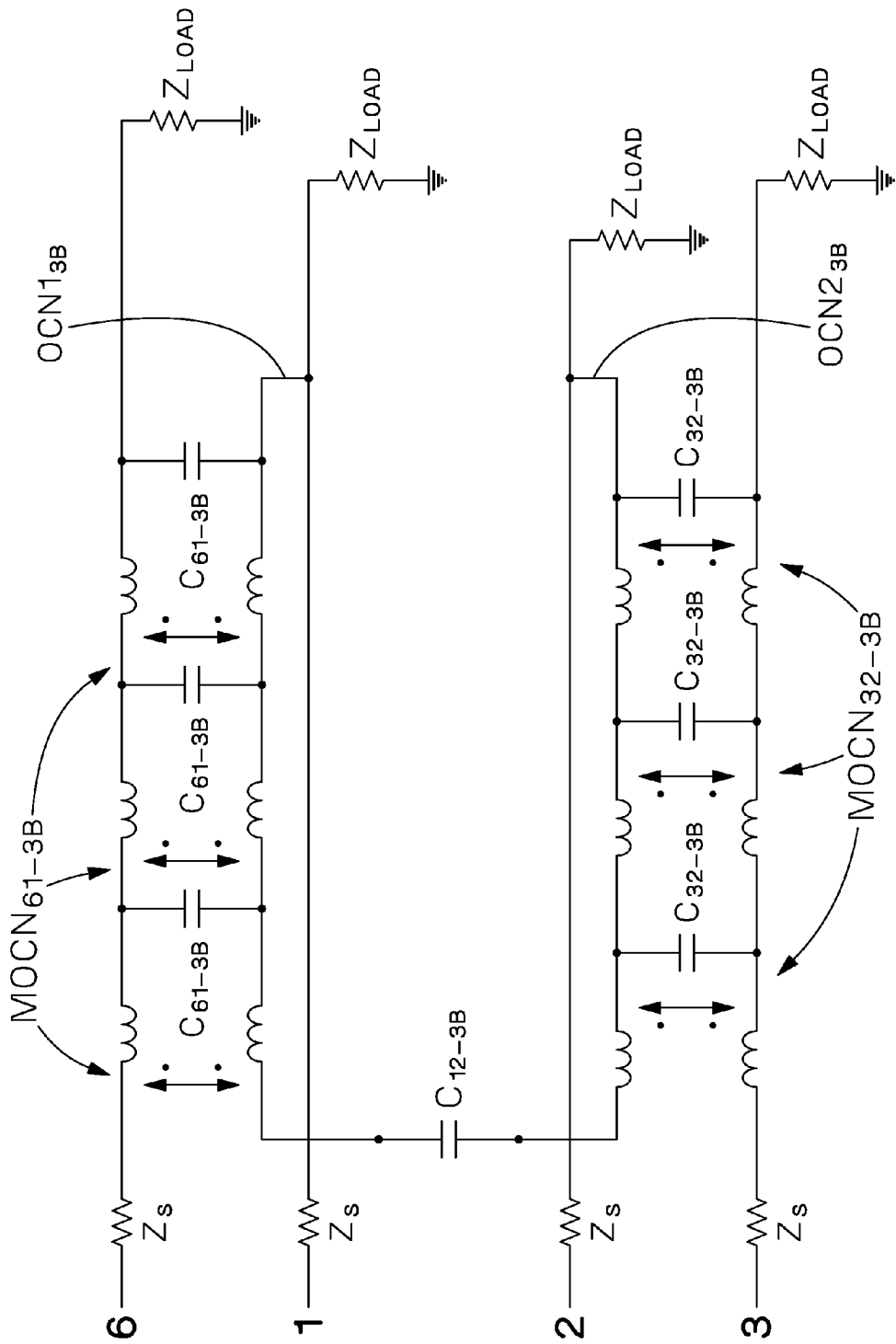
FIG. 3B illustrates a type 2 orthogonal network producing a net crosstalk signal according to an embodiment of the present invention.

FIG. 3B illustrates how the orthogonal network of FIG. 3A can be implemented to provide a net resultant crosstalk signal. The desired coupling between pair 1:2 and pair 3:6 is achieved through the inductive ($MOCN_{61-3B}$) and capacitive ($C_{61-3B}$) couplings between conductor 6 and an offshoot trace $OCN1_{3B}$ of conductor 1, and the inductive ($MOCN_{32-3B}$) and capacitive ($C_{32-3B}$) couplings between conductor 3 and an offshoot trace $OCN2_{3B}$ of conductor 2. The orthogonal network is enabled with a capacitive coupling $C_{12-3B}$ (e.g., a discrete capacitor) positioned between the offshoot traces of $OCN1_{3B}$ and $OCN2_{3B}$.

Figure 4A:
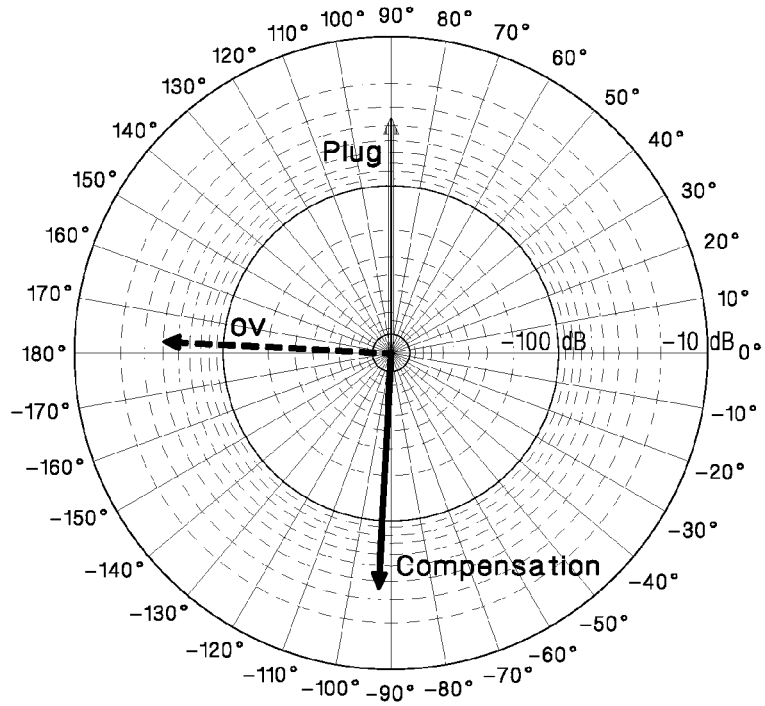
FIG. 4A illustrates a polar plot representative of the orthogonal network of FIG. 3A.
Figure 4B:
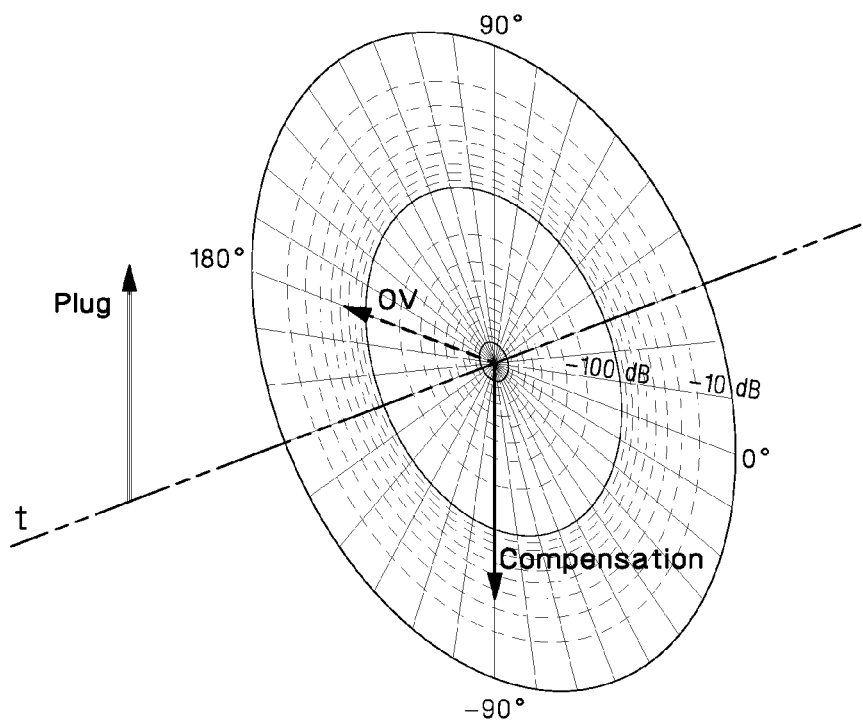
FIG. 4B illustrates signals shown in the polar plot of FIG. 4A on a time scale.
Figure 4C:
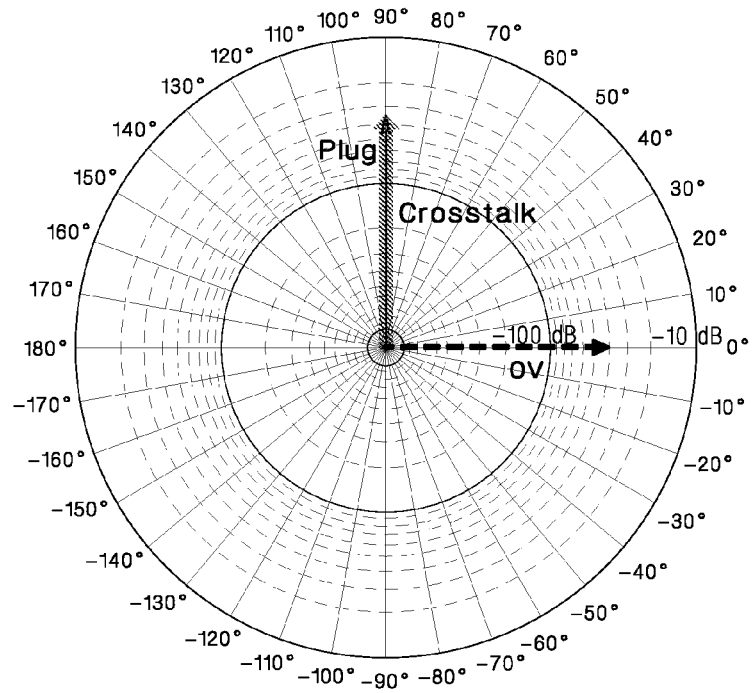
FIG. 4C illustrates a polar plot representative of the orthogonal network of FIG. 3B.
Figure 4D:
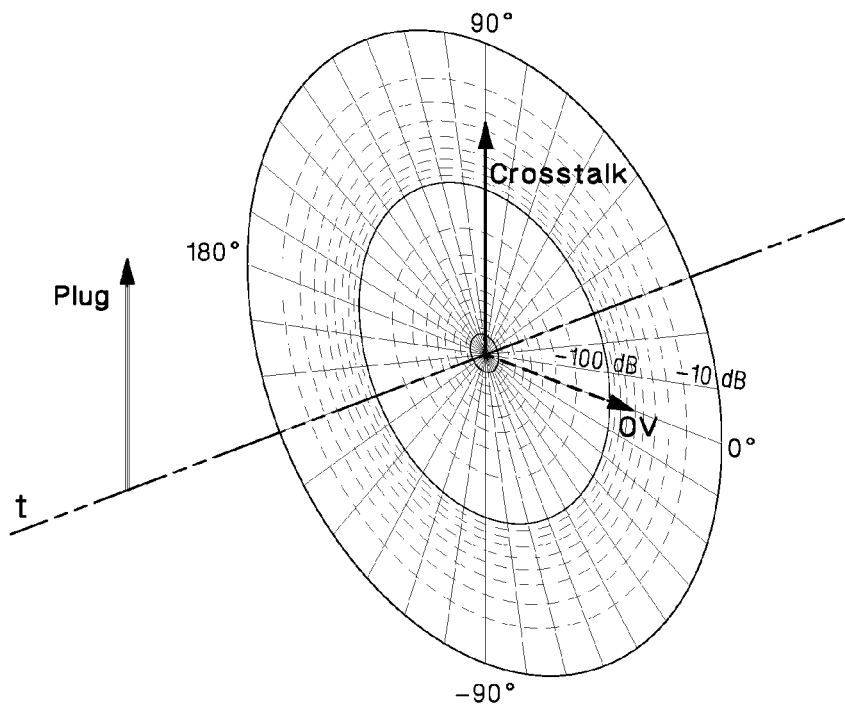
FIG. 4D illustrates signals shown in the polar plot of FIG. 4C on a time scale.

FIGS. 4A and 4C illustrate polar plots representative of the networks of FIGS. 3A and 3B, respectively. The signals produced by both networks of FIGS. 3A and 3B are also shown on a time plots in FIGS. 4B and 4D, respectively. With respect to FIGS. 4A and 4B, the crosstalk produced in the plug is represented by the "Plug" vector with a phase of approximately 90 degrees, and the signal produced by the orthogonal network of FIG. 3A is represented by the "Compensation" vector with a phase of approximately −90 degrees and the orthogonal "OV" vector with a phase of approximately 180 degrees. With respect to FIGS. 4C and 4D, the crosstalk produced in the plug is represented by the "Plug" vector (illustrated by the dotted vector in FIG. 4C) with a phase of approximately 90 degrees, and the signal produced by the orthogonal network of FIG. 3B is represented by the "Crosstalk" vector (illustrated by the solid gray shaded vector in FIG. 4C) with a phase of approximately 90 degrees and the orthogonal "OV" vector with a phase of approximately 0 degrees. In both cases, the orthogonal vector "OV" is rotated approximately 90 degrees clockwise from the "Compensation"/"Crosstalk" vector of the orthogonal network. The −90 degree phase shift of the "OV" vector relative to the "Compensation"/"Crosstalk" vector is a fundamental characteristic of a type 2 orthogonal network.

When the polar plots of a type 1 orthogonal network are compared to the polar plots of a type 2 orthogonal network, one will notice that the orthogonal positioning (clockwise vs. counterclockwise rotation) of the "OV" vector relative to the "Compensation"/"Crosstalk" vector is different for both types of networks. Whereas a type 1 orthogonal network produces an "OV" vector which is rotated approximately 90 degrees counterclockwise from the "Compensation"/"Crosstalk" vector, a type 2 orthogonal network produces an "OV" vector which is rotated approximately 90 degrees clockwise from the "Compensation"/"Crosstalk" vector. The different behavior of the networks can be attributed to the direction of the current through $Z_S$ on a driving conductor relative to the direction of the current through $Z_S$ on a corresponding victim conductor and the underlying layouts of the offshoot traces which permit the current to couple between the corresponding driving and victim conductors. If the direction of the resulting current through $Z_S$ on the victim conductor is opposite of the direction of the current through $Z_S$ on the driving conductor, then the network may be considered to be a type 1 orthogonal network and the "OV" vector can be expected to have a +90 degree phase shift relative to the "Compensation"/"Crosstalk" vector. If, however, the direction of the resulting current through $Z_S$ on the victim conductor is the same as the direction of the current through $Z_S$ on the driving conductor, then the network may be considered to be a type 2 orthogonal network and the "OV" vector can be expected to have a −90 degree phase shift relative to the "Compensation"/"Crosstalk" vector. For example, in the type 1 orthogonal network shown in FIG. 1A, if conductor 6 is considered to be the driving conductor, due to the nature of inductive coupling $MOCN_{62-1A}$ and the layout of the offshoot trace $OCN2_{1A}$, the current through $Z_S$ in the corresponding victim conductor 2 will have an opposite direction of the current through $Z_S$ in conductor 6. On the other hand, in the type 2 orthogonal network shown in FIG. 3A, if conductor 6 is considered to be the source signal driving conductor, due to the nature of inductive coupling $MOCN_{62-3,4}$ and the layout of the offshoot trace $OCN2_{3,4}$, the current through $Z_S$ in the corresponding victim conductor 2 will have the same direction as the current through $Z_S$ in conductor 6.

Each of the orthogonal networks shown in FIGS. 1A, 1B, 3A, and 3B shows two signal conductors coupling to two offshoot traces, causing coupling to occur between all four signal conductors of the two differential pairs. However, an orthogonal network implemented between two differential pairs can also be realized by having only one conductor couple to one offshoot trace. Two examples of such single-sided orthogonal networks are shown in FIGS. 5 and 6.

Figure 5:
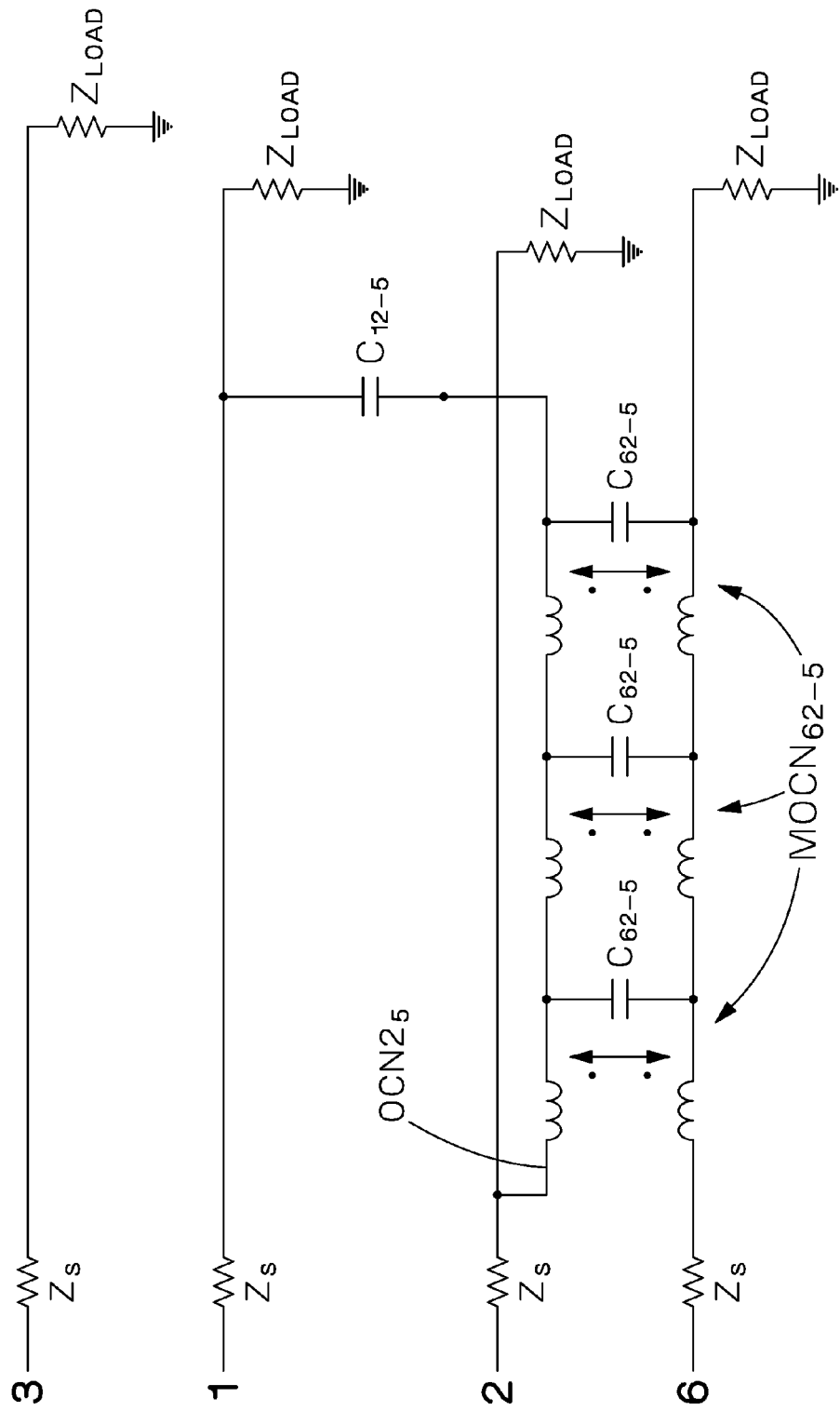
FIG. 5 illustrates a type 1 orthogonal network producing a net compensation signal according to an embodiment of the present invention.

FIG. 5 illustrates a single-sided type 1 orthogonal network in accordance with one exemplary embodiment. Like the other networks described herein, the network of FIG. 5 may be implemented inside of a communication jack (e.g., on a PCB) by way of discrete elements, distributed couplings, or any combinations thereof.

The network of FIG. 5 is illustrated with reference to the 1:2 and 3:6 conductor pairs and achieves the desired compensation between said pairs through inductive and capacitive couplings. In particular, the desired compensation between pair 1:2 and pair 3:6 is achieved through the inductive ($MOCN_{62-5}$) and capacitive ($C_{62-5}$) couplings between conductor 6 and an offshoot trace $OCN2_5$ of conductor 2. The orthogonal network is enabled with a capacitive coupling $C_{12-5}$ (e.g., a discrete capacitor) positioned between the offshoot trace $OCN2_5$ and conductor 1. The net resultant signal produced by this network would typically be considered a compensation signal. However, it should be understood that a single-sided type 1 orthogonal network can be arranged such that the inductive and capacitive couplings occur between certain conductors to produce a net resultant crosstalk signal. For example, the network can be arranged so that the inductive ($MOCN_{62-5}$) and capacitive ($C_{62-5}$) couplings occur between conductor 3 and the offshoot trace $OCN2_5$, with a capacitive coupling $C_{12-5}$ remaining between the offshoot trace $OCN2_5$ and conductor 1. Such a configuration would yield a net resultant signal that is generally considered to be a crosstalk signal. It should be further understood that the implementation of the single-sided orthogonal network of FIG. 5 on conductors 6 and 2 is non-limiting, and other embodiments of a single-sided orthogonal network may be implemented on any desired conductor combination (e.g., conductors 3 and 1).

Figure 6:
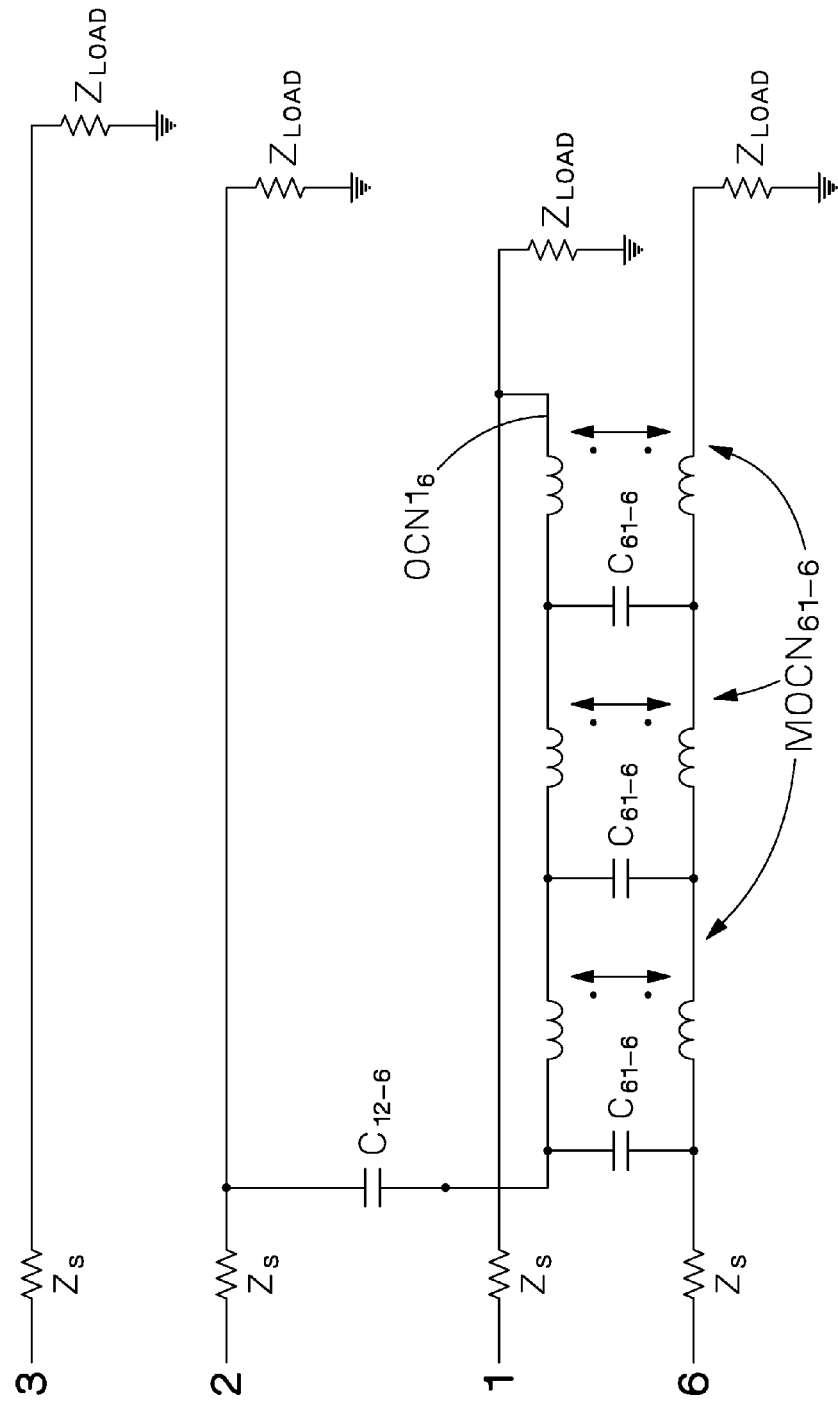
FIG. 6 illustrates a type 2 orthogonal network producing a net crosstalk signal according to an embodiment of the present invention.

FIG. 6 illustrates a single-sided type 2 orthogonal network in accordance with an exemplary embodiment. Like the other networks described herein, the network of FIG. 6 may be implemented inside of a communication jack (e.g., on a PCB) by way of discrete elements, distributed couplings, or any combinations thereof. The network of FIG. 6 is shown with reference to the 1:2 and 3:6 conductor pairs and achieves the desired coupling between said pairs through inductive and capacitive couplings. In particular, the desired coupling between pair 1:2 and pair 3:6 is achieved through the inductive ($MOCN_{61-6}$) and capacitive ($C_{61-6}$) couplings between conductor 6 and an offshoot trace $OCN1_6$ of conductor 1. The orthogonal network is enabled with a capacitive coupling $C_{12-6}$ (e.g., a discrete capacitor) positioned between the offshoot trace $OCN1_6$ and conductor 2. The net resultant signal produced by this network would typically be considered a crosstalk signal. However, similar to the single-sided type 1 orthogonal network, it should be understood that a single-sided type 2 orthogonal network can be arranged such that the inductive and capacitive couplings occur between certain conductors to produce a net resultant compensation signal (e.g., the inductive ($MOCN_{61-6}$) and capacitive ($C_{61-6}$) couplings occur between conductor 3 and the offshoot trace $OCN1_6$, with a capacitive coupling $C_{12-6}$ remaining between the offshoot trace $OCN1_6$ and conductor 2). Likewise, it should be further understood that the implementation of the single-sided orthogonal network of FIG. 6 on conductors 6 and 1 is non-limiting, and other embodiments of a single-sided orthogonal network may be implemented on any desired conductor combination (e.g., conductors 3 and 2).

As discussed in some detail in the U.S. patent application Ser. No. 13/681,480, the vectors representing the couplings of the orthogonal networks change in magnitude depending on the frequency of the signal transmitted across the conductors. Furthermore, in some embodiments the magnitude of the vector representing the non-shunting capacitive coupling (e.g., the "Compensation" vector in FIG. 2A) changes at a rate that is different than the rate of change of the magnitude of the vector representing the inductive coupling in combination with the shunt capacitive coupling (e.g., the "OV" vector in FIG. 2A). As a result, in some instances, the desired ratio of the vectors' magnitudes may be difficult to attain. For example, the "Compensation" vector may grow too fast in relation to the "OV" vector (or conversely, the "OV" vector may grow too slow in relation to the "Compensation" vector) to realize a desired result. In such instances, it may be possible to achieve a desired result by varying and/or combining the type 1 and type 2 orthogonal networks to produce expanded or otherwise hybrid orthogonal networks.

Figure 7A:
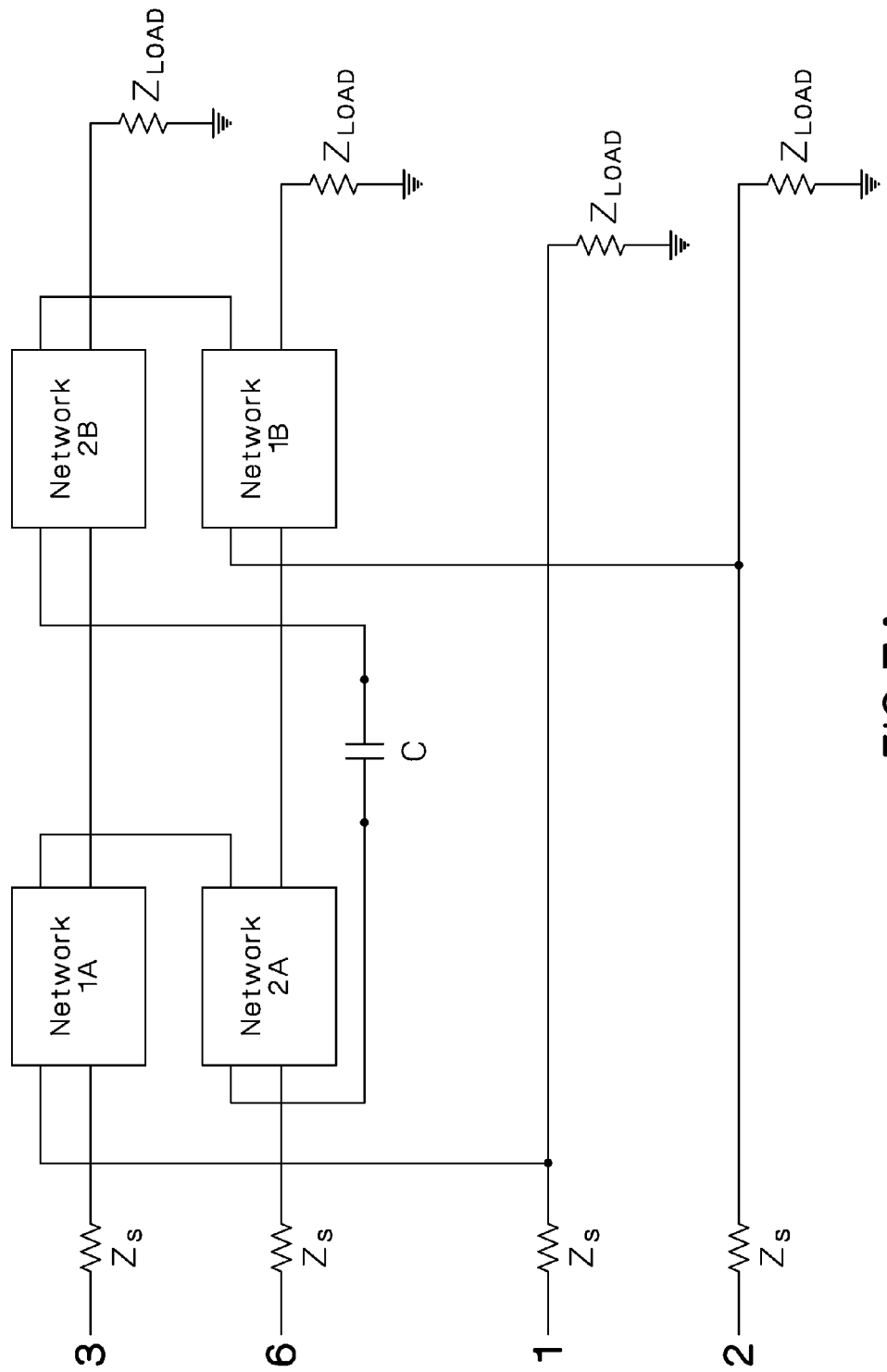
FIG. 7A illustrates a block diagram of a hybrid orthogonal network according to an embodiment of the present invention.
Figure 7B:
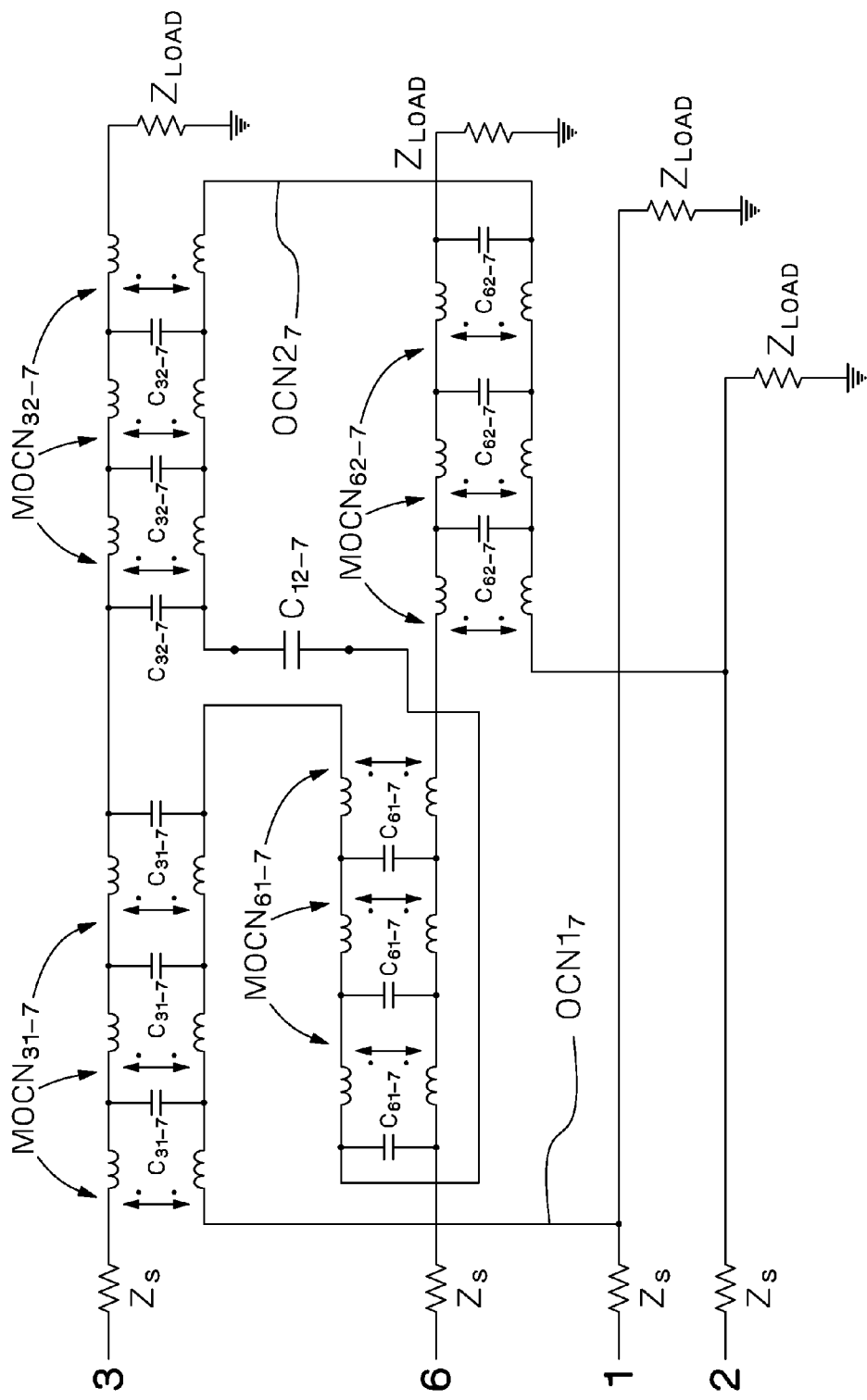
FIG. 7B illustrates an exemplary schematic of the orthogonal network of FIG. 7A.

Similar to the previous embodiments, hybrid orthogonal networks can be implemented inside of a communication jack (e.g., on a PCB) by way of discrete elements, distributed couplings, or any combinations thereof. One exemplary embodiment of such a hybrid orthogonal network is illustrated in FIGS. 7A and 7B with reference to the 1:2 and 3:6 conductor pairs. FIG. 7A shows a generalized representation of this hybrid network and FIG. 7B shows a more detailed schematic view thereof. This network is comprised of four networks, Network 1A, Network 2A, Network 1B, and Network 2B, which may be referred to as sub-networks and may themselves comprise type 1, type 2, or hybrid orthogonal networks. Network 1A is a type 1 orthogonal network which provides inductive ($MOCN_{31-7}$) and capacitive ($C_{31-7}$) couplings between an offshoot trace $OCN1_7$ of conductor 1 and conductor 3. Network 2A is a type 2 orthogonal network which provides inductive ($MOCN_{61-7}$) and capacitive ($C_{61-7}$) couplings between the offshoot trace $OCN1_7$ and conductor 6. Network 1B is a type 1 orthogonal network which provides inductive ($MOCN_{62-7}$) and capacitive ($C_{62-7}$) couplings between an offshoot trace $OCN2_7$ of conductor 2 and conductor 6. And Network 2B is a type 2 orthogonal network which provides inductive ($MOCN_{32-7}$) and capacitive ($C_{32-7}$) couplings between the offshoot trace $OCN2_7$ and conductor 3. Networks 1A and 1B couple conductors 1 and 3, and 2 and 6, respectively, and thus could be said to produce a compensation signal. Networks 2A and 2B couple conductors 1 and 6, and 2 and 3, respectively, and thus could be said to produce a crosstalk signal. All the networks are enabled with a capacitive coupling $C_{12-7}$ (e.g., a discrete capacitor) positioned between the offshoot traces $OCN1_7$ and $OCN2_7$.

Figure 8:
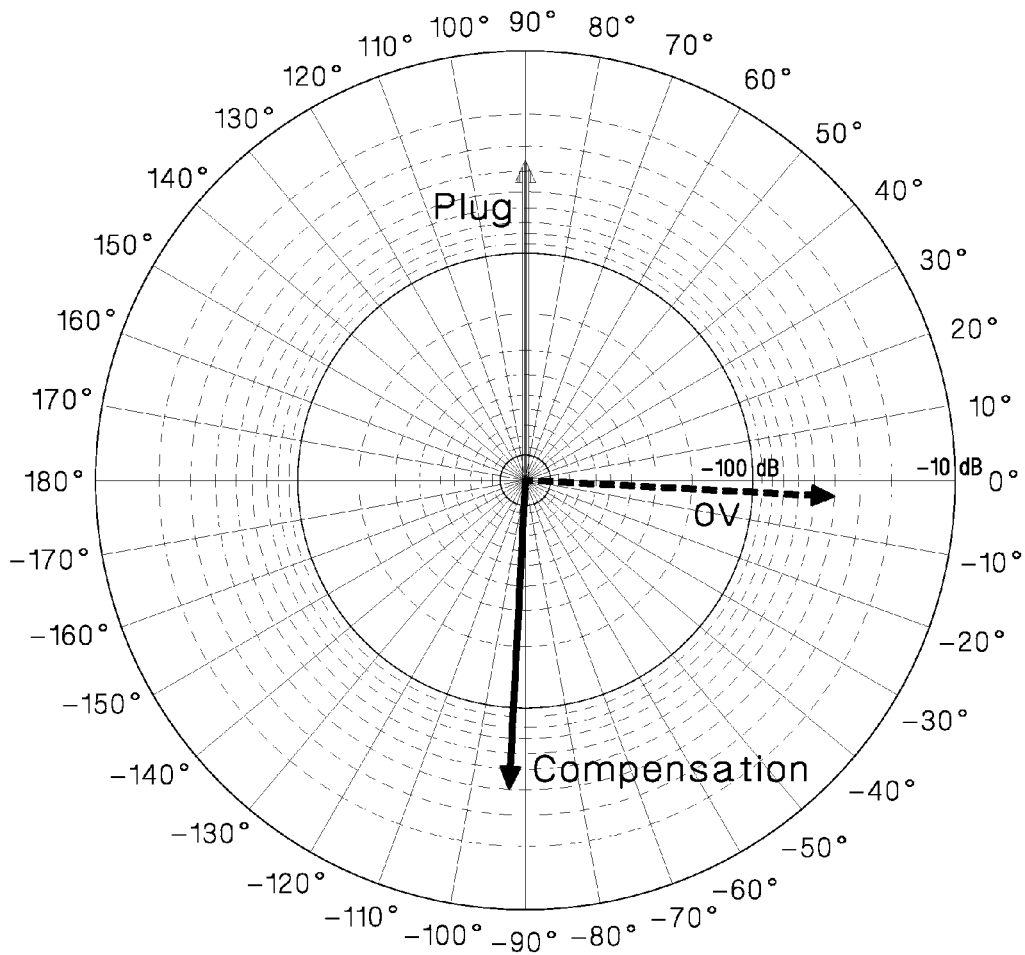
FIG. 8 illustrates a polar plot representative of the orthogonal network of FIG. 7B.

FIG. 8 shows a polar plot representative of the circuit in FIG. 7B. The crosstalk produced in the plug is represented by the "Plug" vector with a phase of approximately 90 degrees. The "Compensation" vector is the sum of the compensation signals produced by the Networks 1A and 1B and the crosstalk signals produced by the Networks 2A and 2B. When the net capacitive couplings in Networks 1A and 1B are larger than the net capacitive couplings in Networks 2A and 2B, the net effect will be a compensating vector with a phase of approximately −90 degrees, as shown in FIG. 8. However, if the net capacitive couplings in Networks 1A and 1B are smaller than the net capacitive couplings in Networks 2A and 2B, the net effect will be a crosstalk vector with a phase of approximately 90 degrees. The orthogonal "OV" vector is the sum of the orthogonal vectors produced by Networks 1A, 1B, 2A, and 2B. Given that all the orthogonal vectors produced by the circuit of FIG. 7B have a phase of approximately 0 degrees, the resulting summation vector "OV" also has a phase of approximately 0 degrees as shown in FIG. 8.

Figure 9:
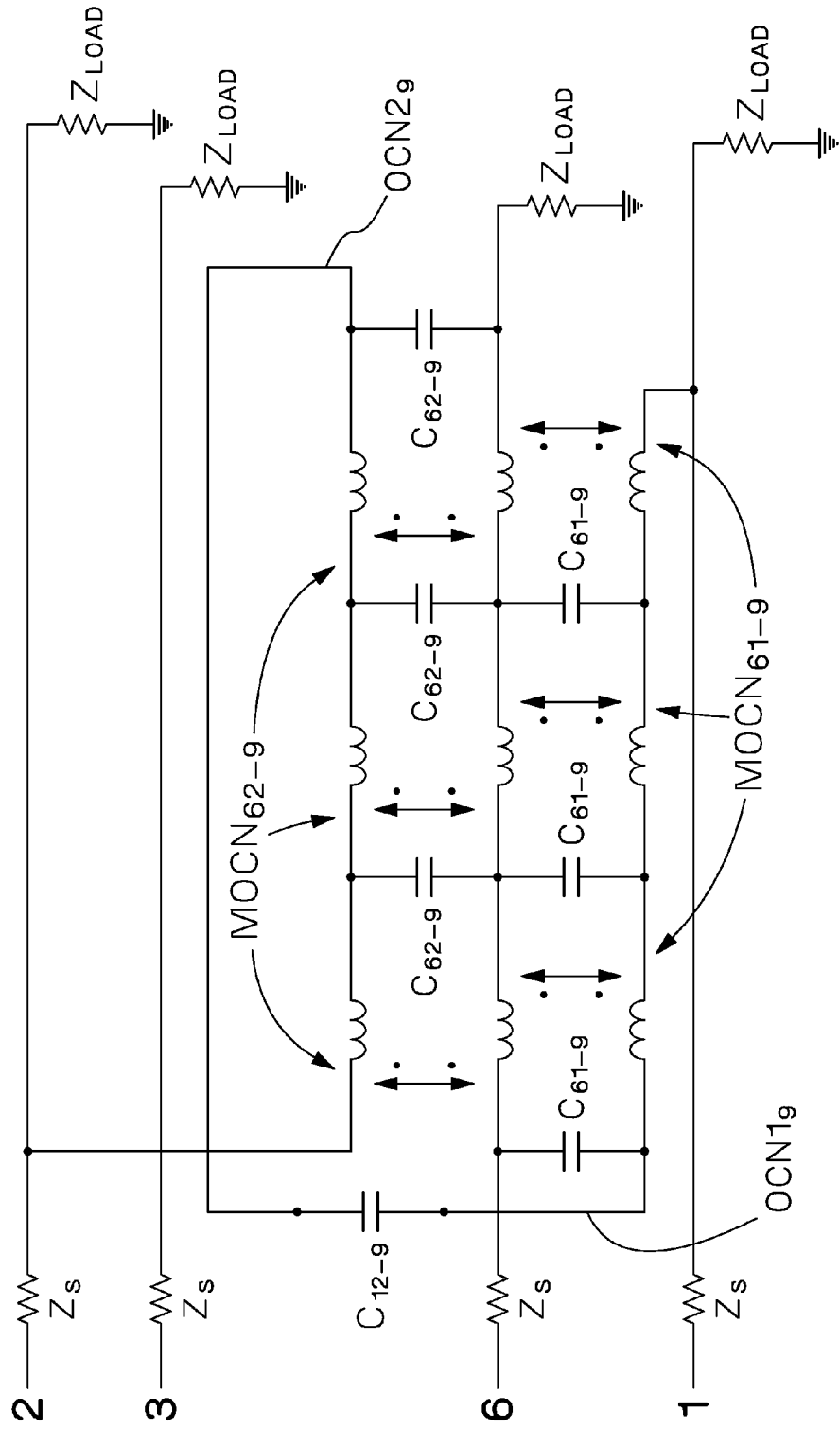
FIG. 9 illustrates a hybrid orthogonal network according to another embodiment of the present invention.

FIG. 9 illustrates another embodiment of a hybrid orthogonal network. This embodiment shows the implementation of type 1 and type 2 orthogonal networks occurring concurrently in the same location to produce a net resultant vector within a single stage. In other words, whereas in the embodiment described in FIGS. 7A and 7B the orthogonal networks which produced the compensation and crosstalk signals and coupled to a single conductor (i.e., Networks 1A and 2B which coupled to conductor 3, or Networks 2A and 1B which coupled to conductor 6) occurred serially, the embodiment of FIG. 9 allows both the compensation and crosstalk producing orthogonal networks to couple to a conductor (in this case conductor 6) concurrently. Note that the use of the term "concurrently" or the like herein is not necessarily mean to be absolute, but can instead mean a lack of a time delay that is significant enough to appreciably affect the analysis of a circuit.

The hybrid orthogonal network of FIG. 9 is illustrated with reference to the 1:2 and 3:6 conductor pairs and achieves a desired coupling by using concurrent type 1 and type 2 orthogonal networks. The type 1 orthogonal network is comprised of the inductive ($MOCN_{62-9}$) and capacitive ($C_{62-9}$) couplings occurring between the offshoot trace $OCN2_9$ of conductor 2 and conductor 6. Since this network provides coupling between conductors 2 and 6, when enabled, it produces a signal that would typically be considered a compensation signal. The type 2 orthogonal network is comprised of the inductive ($MOCN_{61-9}$) and capacitive ($C_{61-9}$) couplings between the offshoot trace $OCN1_9$ of conductor 1 and conductor 6. Since this network provides coupling between conductors 1 and 6, when enabled, it produces a signal that would typically be considered a crosstalk signal. The entire hybrid network is enabled with a capacitive coupling $C_{12-9}$ (e.g., a discrete capacitor) positioned between the offshoot traces $OCN1_9$ and $OCN2_9$.

Figure 10A:
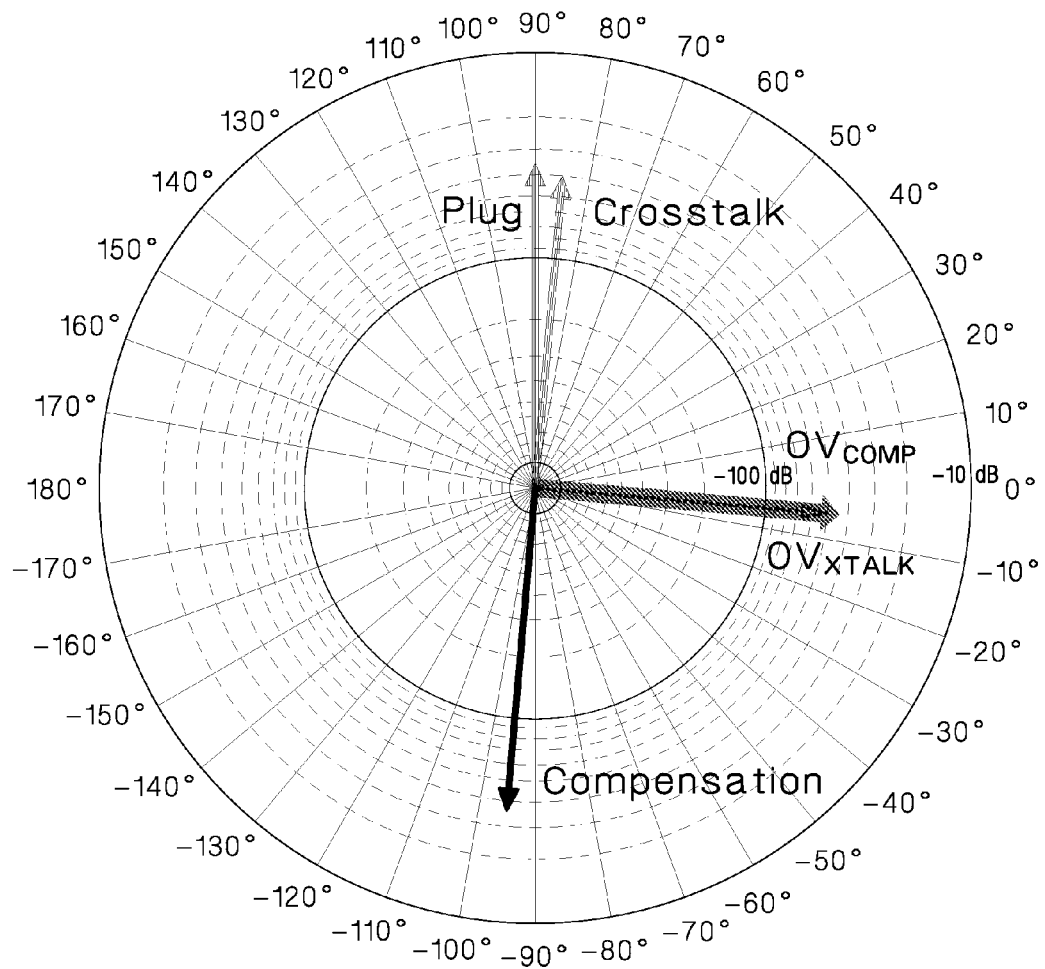
FIGS. 10A and 10B illustrate polar plots representative of the orthogonal network of FIG. 9.

FIG. 10A shows a polar plot representative of the hybrid orthogonal network of FIG. 9. The crosstalk produced in the plug is represented by the "Plug" vector with a phase of approximately 90 degrees. The signal of the type 1 orthogonal network is represented by the "Compensation" vector with a phase of approximately −90 degrees and the "$OV_{COMP}$" vector (illustrated by the solid gray shaded vector) with a phase of approximately 0 degrees. The "Compensation" vector is the result of the $C_{62-9}$ capacitive coupling and the "$OV_{COMP}$" vector is the result of the $MOCN_{62-9}$ inductive coupling in combination with the $C_{12-6}$ capacitive coupling. The signal of the type 2 orthogonal network is represented by the "Crosstalk" vector with a phase of approximately 90 degrees and the "$OV_{XTALK}$" vector (illustrated by the dotted vector) with a phase of approximately 0 degrees. The "Crosstalk" vector is the result of the $C_{61-6}$ capacitive coupling and the "$OV_{XTALK}$" vector is the result of the $MOCN_{61-9}$ inductive coupling in combination with the $C_{12-9}$ capacitive coupling.

Figure 10B:
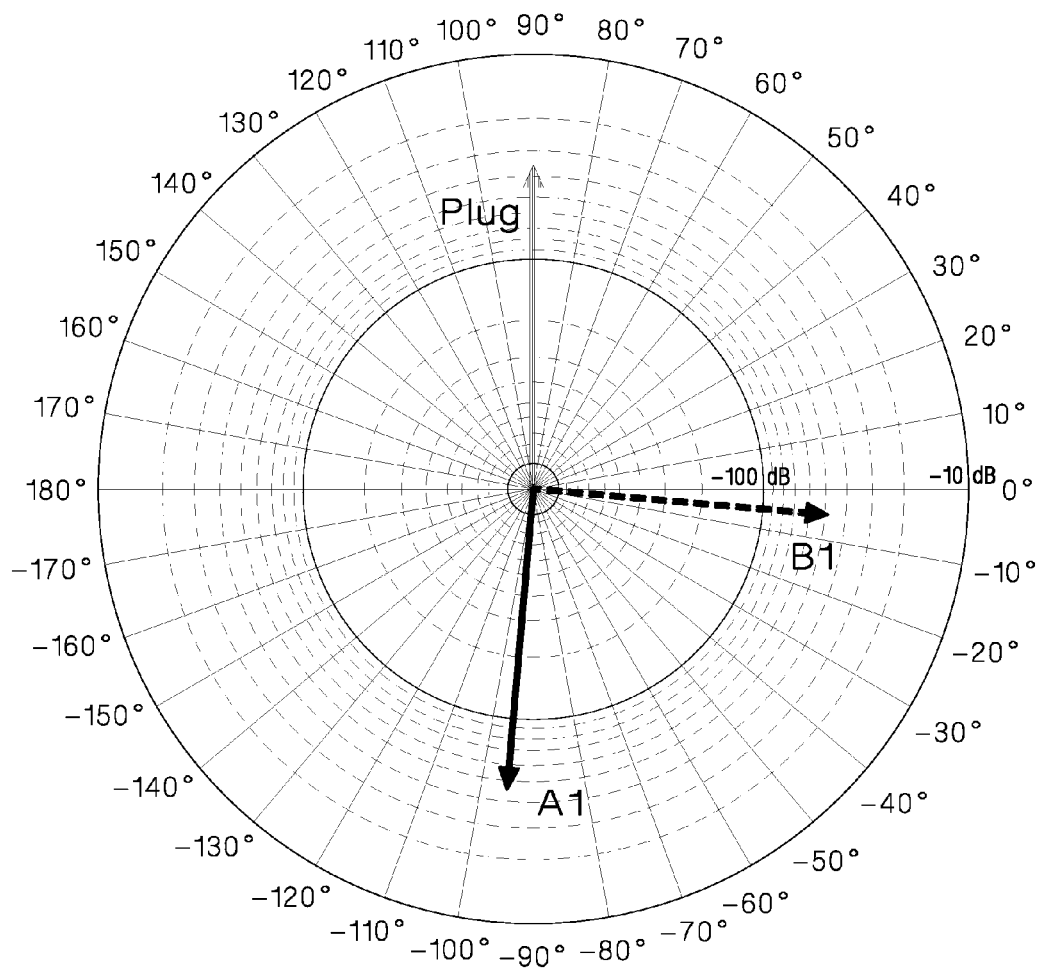

The polar plot of FIG. 10A can be simplified to show the net resultant vectors by summing the "Crosstalk" and "Compensation" vectors to produce the "A1" vector, and the "$OV_{XTALK}$" and "$OV_{COMP}$" vectors to produce the "B1" vector, resulting in the polar plot of FIG. 10B. Note that by providing concurrent type 1 and type 2 orthogonal networks, either of which may produce compensation or crosstalk coupling, one may be able to better manage the relationship between the net non-shunting capacitive coupling (which in the case the orthogonal network of FIG. 9 produces the net "A1" vector) and the net inductive coupling combined with the shunting capacitive coupling (which in the case the orthogonal network of FIG. 9 produces the net "B1" vector). Also note that the magnitudes of the "Compensation" and "Crosstalk" vectors can be varied within the hybrid network of FIG. 9 (by adjusting the amount of coupling) to produce a net resultant vector "A1" that provides either a net crosstalk or a net compensation signal. For example, if the magnitude of the "Crosstalk" vector was greater than the magnitude of the "Compensation" vector, the net resultant vector would provide a net crosstalk signal. The hybrid orthogonal network of FIG. 9 can also be modified, in accordance with the present specification, to adjust the directionality of either of the "OV" vectors to obtain a specifically desired net resultant "B1" vector.

As a result of using a hybrid orthogonal network, one may be able to achieve a wide range of ratios between the "A1" and "B1" vectors within a single stage. Such versatility may permit the use of hybrid orthogonal networks in an array of applications, including providing necessary compensation within a communication jack to achieve Category 6 (CAT6), Category 6a (CAT6a), or greater performance.

Figure 11:
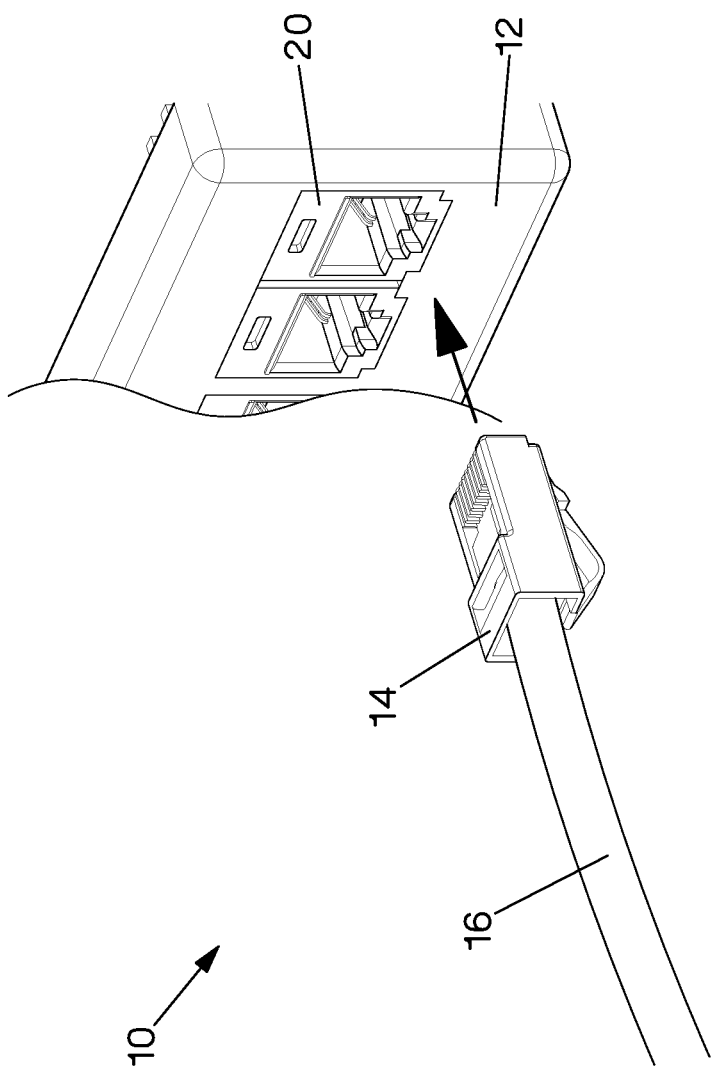
FIG. 11 illustrates a perspective view of a portion of a communication system according to an embodiment of the present invention.

FIG. 11 shows a typical application of an exemplary jack which may employ one or more compensation network(s) in accordance with various embodiments of the present invention. This figure illustrates an electrical system 10 having a patch panel 12 with at least one jack 20 mounted therein and connected to a data cable (not shown). A plug 14, connected to a cable 16, can mate with the jack(s) 20 which allows data to flow in both directions through these components.

Figure 12:
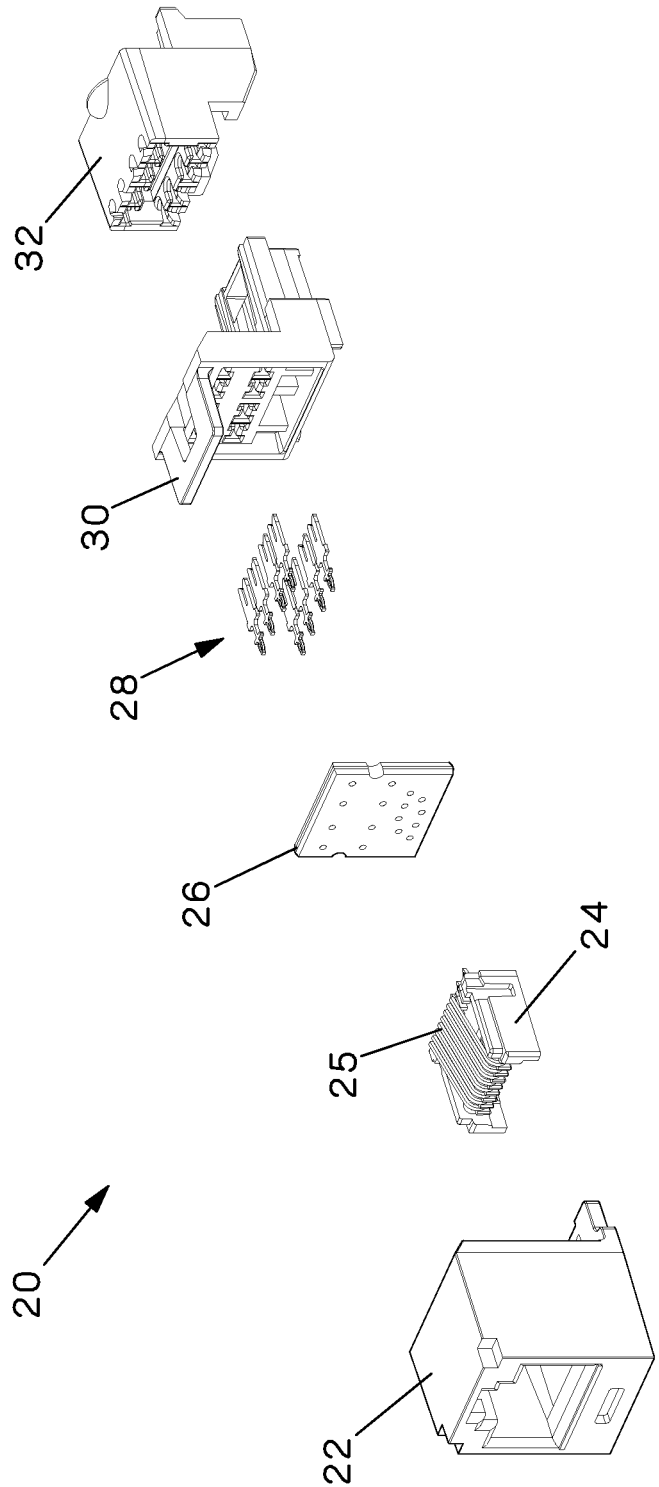
FIG. 12 illustrates an exploded view of a communication jack used in the communication system of FIG. 11, according to an embodiment of the present invention.

As shown in FIG. 12, in one exemplary embodiment, jack 20 includes a front housing 22, a front sled 24 with plug interface contacts (PICs) 25, a PCB 26, insulation displacement contacts (IDCs) 28, a rear sled 30, and a wire cap 32. Other elements, details, and/or exemplary embodiments of jack 20 can be found in U.S. Pat. No. 7,052,328 (Ciezak et al.), entitled "Electronic Connector And Method Of Performing Electronic Connection," issued on May 30, 2006; U.S. Pat. No. 7,481,681 (Caveney et al.), entitled "Electrical Connector With Improved Crosstalk Compensation," issued on Jan. 27, 2009; U.S. Pat. No. 7,452,245 (Doorhy et al.), entitled "Wire Containment Cap," issued on Nov. 18, 2008; and U.S. Pat. No. 7,476,120 (Patel et al.), entitled "Wire Containment Cap With Integral Strain Relief Clip," issued on Jan. 13, 2009, all of which are incorporated herein by reference in their entirety.

Figure 13:
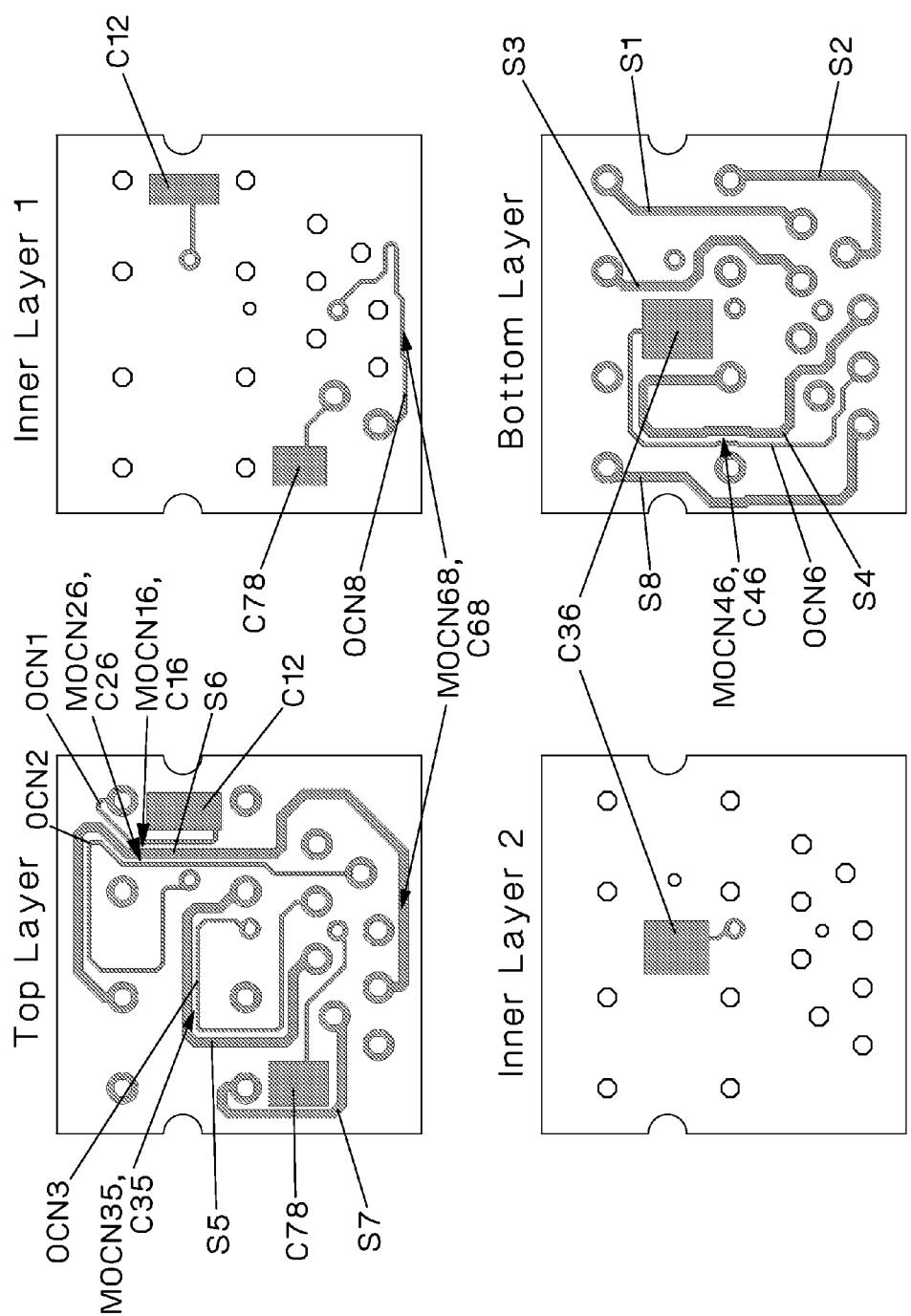
FIG. 13 illustrates top views of four conductive layers of a printed circuit board of the jack of FIG. 12 according to an embodiment of the present invention.
Figure 14:
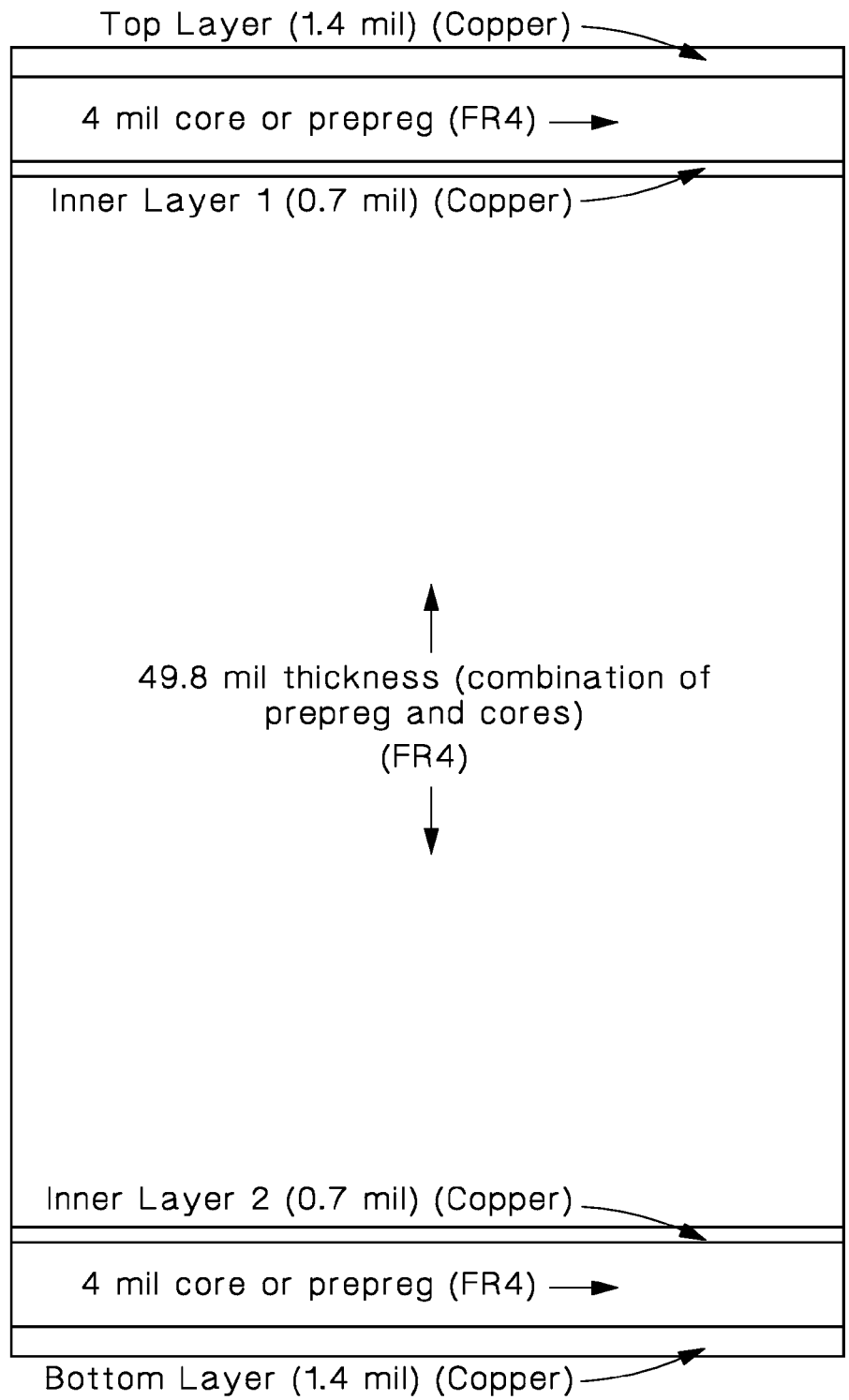
FIG. 14 illustrates a printed circuit board stack-up according to an embodiment of the present invention.
Figure 15:
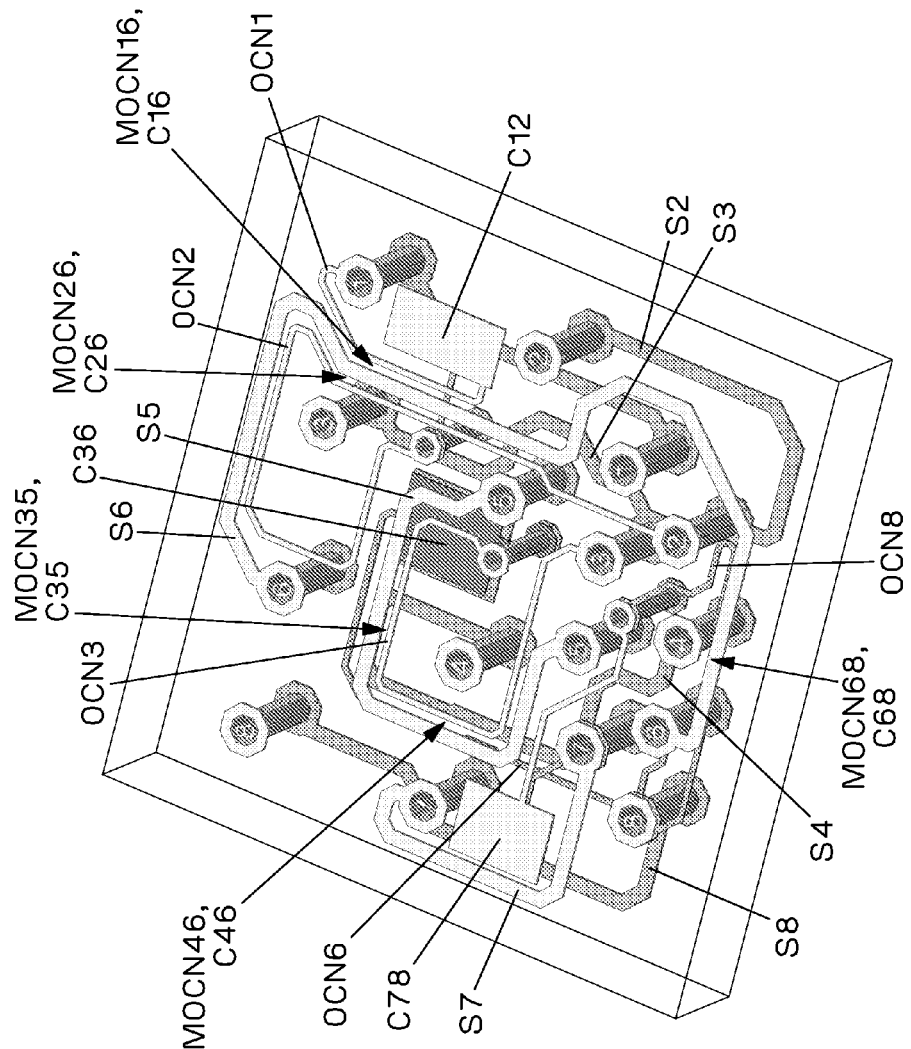
FIG. 15 illustrates an isometric view of the assembled printed circuit board of FIGS. 13 and 14.
Figure 16:
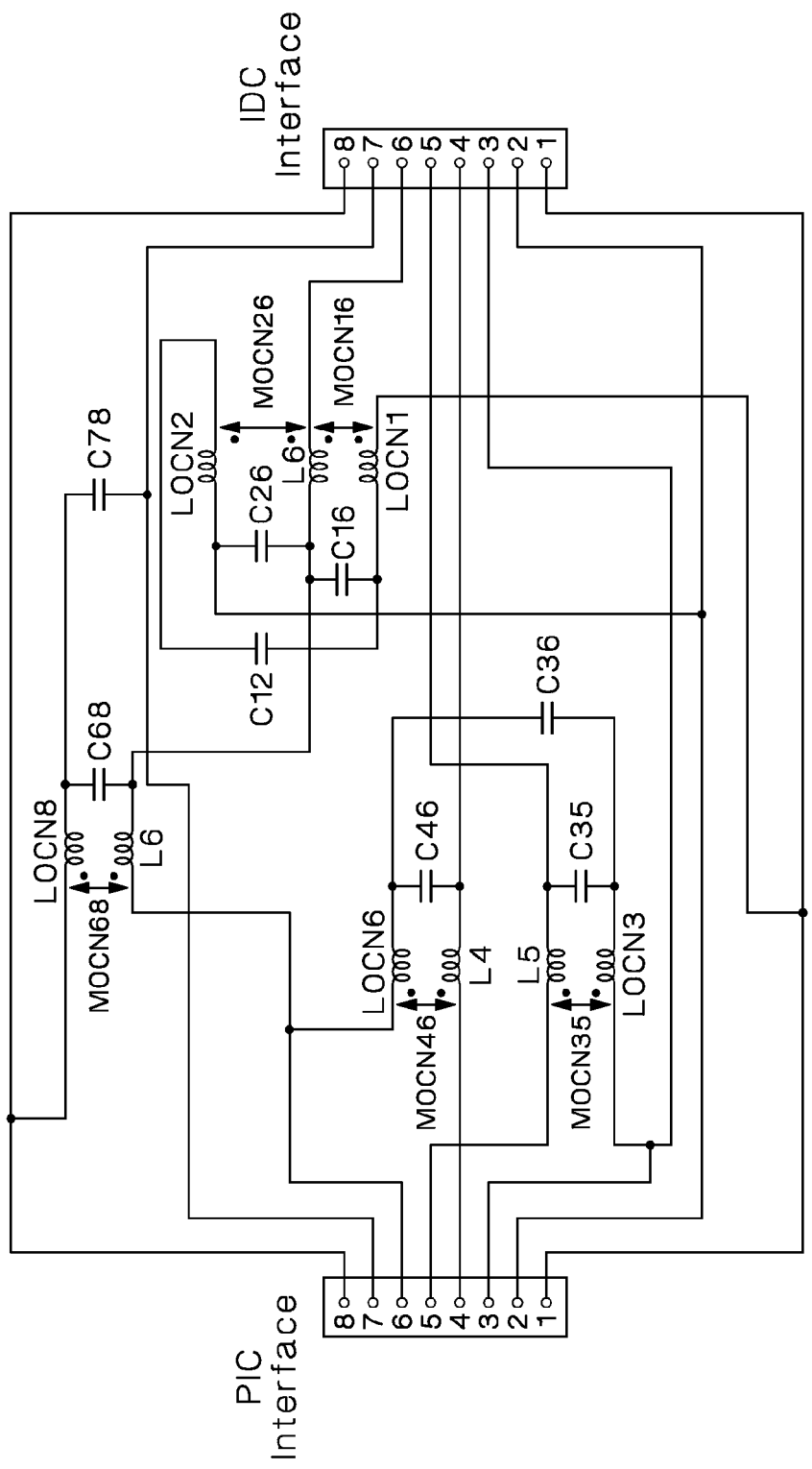
FIG. 16 illustrates a schematic view of the printed circuit board of FIG. 15.

An exemplary embodiment of PCB 26, which includes multiple embodiments of orthogonal networks thereon, is shown in FIGS. 13-16. FIG. 13 illustrates the individual layers of PCB 26. In this embodiment, PCB 26 can use the stack-up shown in FIG. 14. PCB 26 can have a 4-layer construction, with capacitors being formed by the top layer and inner layer 1, and the bottom layer and inner layer 2. This may be achieved by using a 4-mil core or prepreg (partially cured FR4 without copper cladding, for example) at the top and bottom of PCB 26 and standard circuit board assembly materials within the rest of the circuit board. An isometric view of PCB 26 is shown in FIG. 15, and a corresponding schematic is shown in FIG. 16. Note that other PCB constructions (e.g., 2-layer, 6-layer, etc.) can be used.

While the schematic of FIG. 16 illustrates inductors and capacitors as discrete elements, in at least one embodiment, at least some of these elements represent the capacitive and inductive coupling occurring between various electrical traces. Such coupling is generally distributed and may, for example, include: (a) distributed coupling occurring as a result of two traces running within proximity to each other; (b) coupling occurring as a result of discrete elements such as, but not limited to, pad capacitors, finger capacitors, or other discrete capacitors; or (c) a combination thereof.

PCB 26 includes signal traces S1, S2, S3, S4, S5, S6, S7, and S8. Each of the S1-S8 traces respectively correspond to the $1^{st}$-$8^{th}$ plug contacts of a plug having its contacts laid out in accordance with ANSI/TIA-568-C.2, and electronically connect the respective PICs 25 to the respective IDCs 28. These signal traces generate self-inductances with self-inductances L4, L5, and L6 being shown on the respective S4, S5, and S6 signal traces in FIG. 16. Additionally, PCB 26 includes offshoot traces to connect (directly or indirectly) PIC conductors 1 and 2 to capacitor C12, PIC conductors 3 and 6 to capacitor C36, and PIC conductors 7 and 8 to capacitor C78. The offshoot traces may span more than a single layer of the PCB 26. In alternate embodiments, capacitors C12, C36, and C78 may be realized by way of distributed capacitive coupling; discrete elements, including, but not limited to, pad capacitors and finger capacitors; or any combination of distributed capacitive coupling and discrete elements. Additionally, capacitors C12, C36, and C78 may be referred to as "shunt capacitors," as they couple two conductors of the same signal pair. At least some of the offshoot traces comprise traces OCN1, OCN2, OCN3, OCN6, and OCN8, which create self-inductances LOCN1, LOCN2, LOCN3, LOCN6, and LOCN8, respectively.

The result of the signal S traces being within a proximity to the OCN traces is mutual inductive coupling between the respective S and OCN traces. In particular, MOCN16 in PCB 26 is the mutual inductive coupling between S6 (L6) and OCN1 (LOCN1); MOCN26 in PCB 26 is the mutual inductive coupling between S6 (L6) and OCN2 (LOCN2); MOCN46 in PCB 26 is the mutual inductive coupling between S4 (L4) and OCN6 (LOCN6); MOCN35 in PCB 26 is the mutual inductive coupling between S5 (L5) and OCN3 (LOCN3); and MOCN68 in PCB 26 is the mutual inductive coupling between S6 (L6) and OCN8 (LOCN8). Another result of the S traces being within a proximity to the OCN traces is capacitive coupling between the respective S and OCN traces. In particular, C16 in PCB 26 is the capacitive coupling between traces S6 and OCN1; C26 in PCB 26 is the capacitive coupling between traces S6 and OCN2; C46 in PCB 26 is the capacitive coupling between traces S4 and OCN6; C35 in PCB 26 is the capacitive coupling between traces S5 and OCN3; and C68 in PCB 26 is the capacitive coupling between traces S6 and OCN8.

Figure 17:
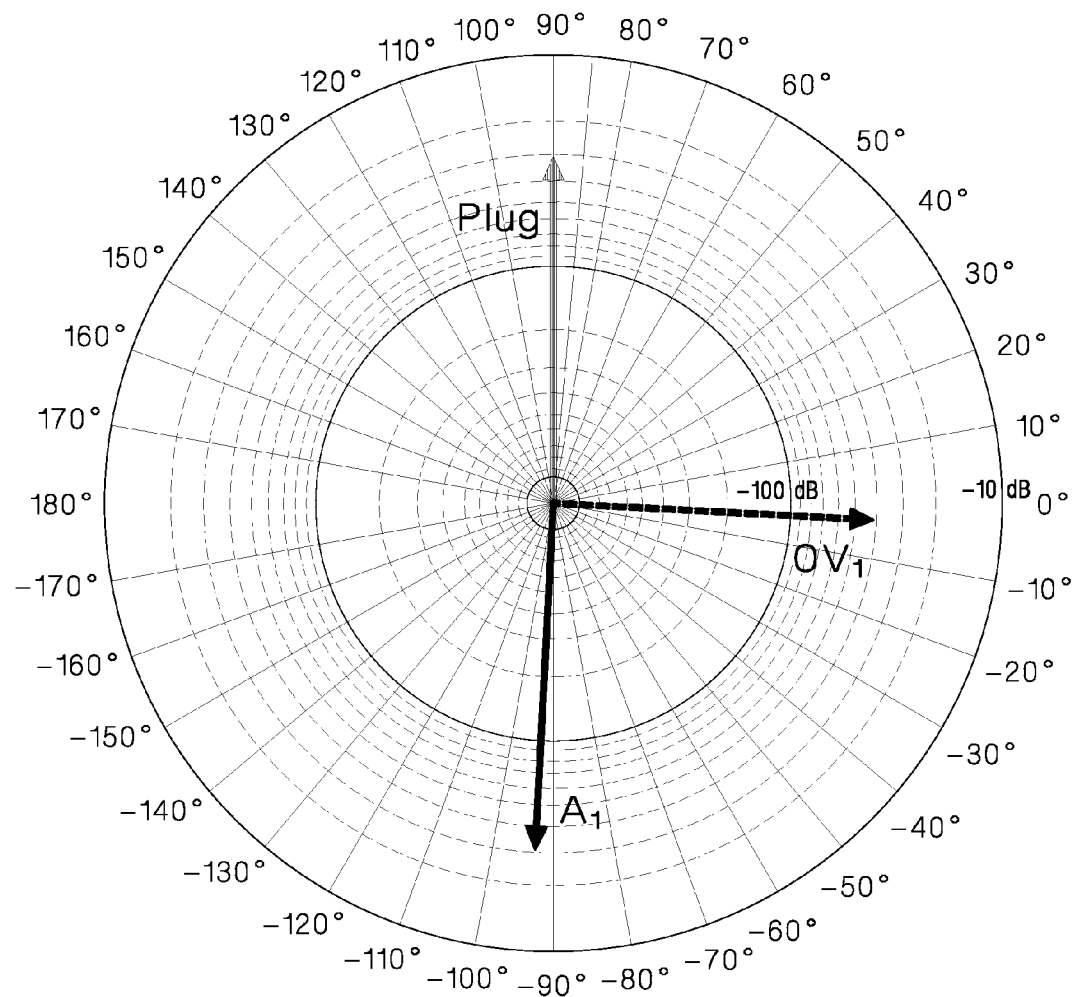
FIG. 17 illustrates a polar plot representative of the orthogonal network on the 3:6-4:5 wire pair of the printed circuit board of FIG. 15.

For wire-pair combination 4:5-3:6, the compensation network located on the PCB 26 is a type 1 orthogonal network which uses traces S4, S5, OCN3, and OCN6, and capacitor C36 to create the desired signal. FIG. 17 illustrates the resulting couplings on a representative polar plot. Traces S4 and OCN6 create the capacitive coupling C46, and traces S5 and OCN3 create the capacitive coupling C35. Each capacitive coupling C46 and C35 is approximately 0.6 pF (picofarads) (+/−20%), and together produce a net compensation vector "$A_1$" of an opposite polarity of the plug crosstalk vector "Plug." Capacitor C36 (approximately 1.8 pF +/−20%) provides a current path between traces OCN3 and OCN6, allowing mutual inductive coupling MOCN46 to occur between traces S4 and OCN6, and mutual inductive coupling MOCN35 to occur between traces S5 and OCN3. Each inductive coupling MOCN46 and MOCN35 is approximately 5 nH (nanohenry) +/−20%. Together, and in combination with the C36 capacitor, both of the inductive couplings MOCN46 and MOCN35 produce a net orthogonal vector "$OV_1$." The inductive couplings MOCN46 and MOCN35 are created by the same PCB artwork, and thus occur in generally the same physical locations, as capacitive couplings C46 and C35, respectively. The net resultant vector of couplings C35, C46, MOCN35, MOCN46, and C36 provides additional NEXT bandwidth which may help to allow wire-pair combination 4:5-3:6 to meet standards for Category 6 and beyond.

Figure 18A:
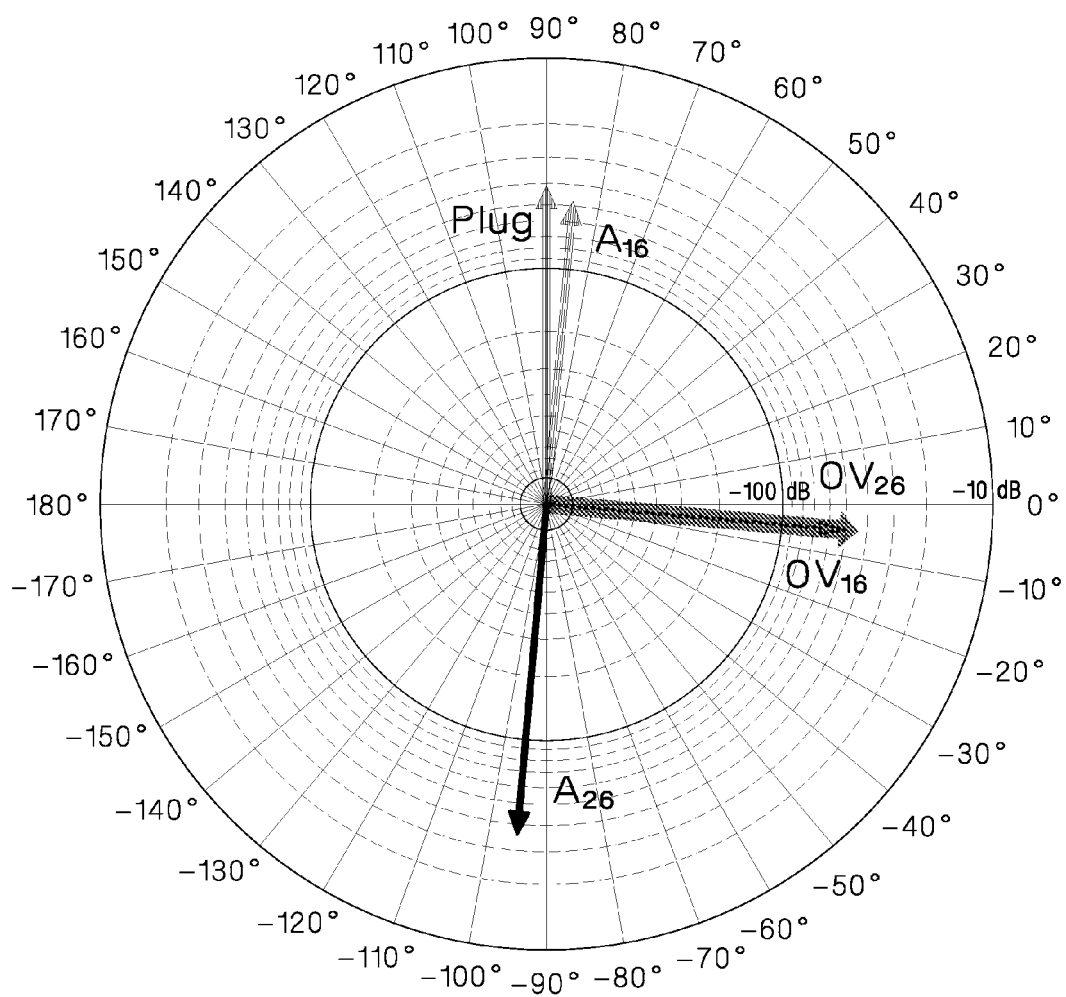
FIGS. 18A and 18B illustrate polar plots representative of the orthogonal network on the 1:2-3:6 wire pair of the printed circuit board of FIG. 15.
Figure 18B:
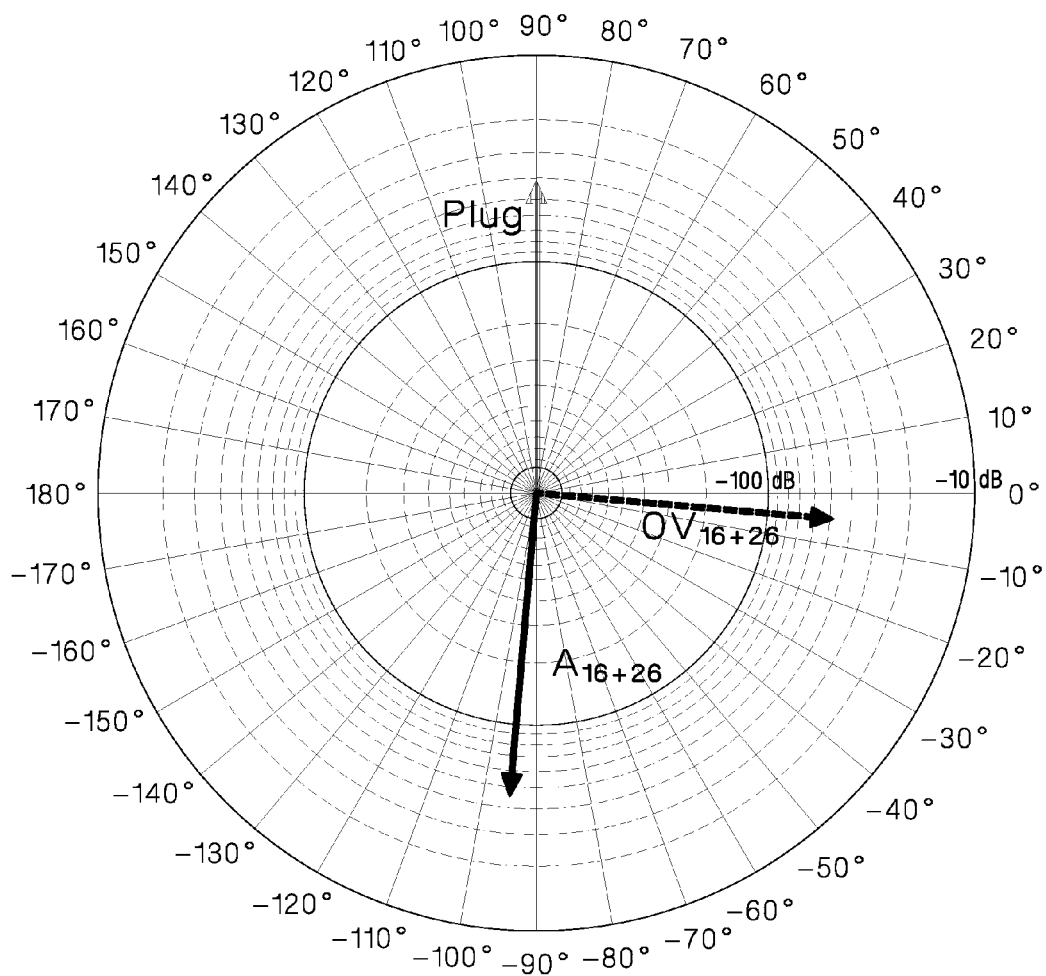

For wire-pair combination 3:6-1:2, the orthogonal network located on the PCB 26 uses traces S6, OCN1, and OCN2, and capacitor C12 to create the desired signal. This network employs a combination of type 1 and type 2 orthogonal networks resulting in a hybrid orthogonal network. FIGS. 18A and 18B illustrate the resulting couplings on a representative polar plot with FIG. 18A showing vectors for the individual type 1 and type 2 networks and FIG. 18B showing a net resultant signal of the hybrid network. In this hybrid network, the type 1 orthogonal network is comprised of the capacitive and inductive couplings occurring between traces S6 and OCN2, and the type 2 orthogonal network is comprised of the capacitive and inductive couplings occurring between traces S6 and OCN1.

In particular, traces S6 and OCN2 create the capacitive coupling C26 (approximately 0.70 pF +/−20%) which produces a compensation vector "$A_{26}$" of an opposite polarity of the plug crosstalk vector "Plug." Traces S6 and OCN1 create capacitive coupling C16 (approximately 0.54 pF +/−20%) which produces a crosstalk vector "$A_{16}$" of the same polarity as the plug crosstalk vector "Plug." The summation of the "$A_{16}$" and "$A_{26}$" vectors produces a net resultant vector "$A_{16+26}$" (see FIG. 18B) having an opposite polarity of the plug crosstalk vector "Plug." Capacitor C12 (approximately 1.3 pF +/−20%) provides a current path between traces OCN1 and OCN2, allowing mutual inductive coupling MOCN16 to occur between traces S6 and OCN1, and mutual inductive coupling MOCN26 to occur between traces S6 and OCN2. Each inductive coupling MOCN16 and MOCN26 is approximately 1.85 nH +/−20%. Since the mutual inductive coupling MOCN16 occurs in a type 2 orthogonal network, its signal (in combination with the shunt capacitor C12), represented by the "$OV_{16}$" vector (illustrated by the dotted vector) in FIG. 18A, has a phase shift of approximately −90 degrees relative to the signal produced by the capacitive coupling C16 (represented by the "$A_{16}$" vector) of that same network. On the other hand, since the mutual inductive coupling MOCN26 occurs in a type 1 orthogonal network, its signal (in combination with the shunt capacitor C12), represented by the "$OV_{26}$" vector (illustrated by the solid gray shaded vector), has a phase shift of approximately 90 degrees relative to the signal produced by the capacitive coupling C26 (represented by vector "$A_{26}$") of that same network. The summation of the "$OV_{16}$" and "$OV_{26}$" vectors produces a net resultant vector "$OV_{16+26}$" which is approximately orthogonal to the "$A_{16+26}$" vector.

The inductive couplings MOCN16 and MOCN26 are created by the same PCB artwork, and thus occur in generally the same physical locations, as capacitive couplings C16 and C26, respectively. Furthermore, the time delay between the type 1 orthogonal network producing the MOCN26 and C26 couplings and the type 2 orthogonal network producing the MOCN16 and C16 couplings is approximately zero. In other words, while there may be a relatively small time delay due to the lengths of the offshoot traces, this delay is insignificant for the purposes of the analysis of this circuit, and coupling along both of the type 1 and type 2 networks can be said to occur concurrently. Such a configuration may allow the compensation network on the 3:6-1:2 wire-pair combination to produce a more desirable range of ratios between the signals represented by the net "$A_{16+26}$" vector and the net "$OV_{16+26}$" vector. The net resultant vector of couplings C16, C26, MOCN16, MOCN26, and C12 provides additional NEXT bandwidth which may help to allow wire-pair combination 3:6-1:2 to meet standards for Category 6 and beyond.

Figure 19:
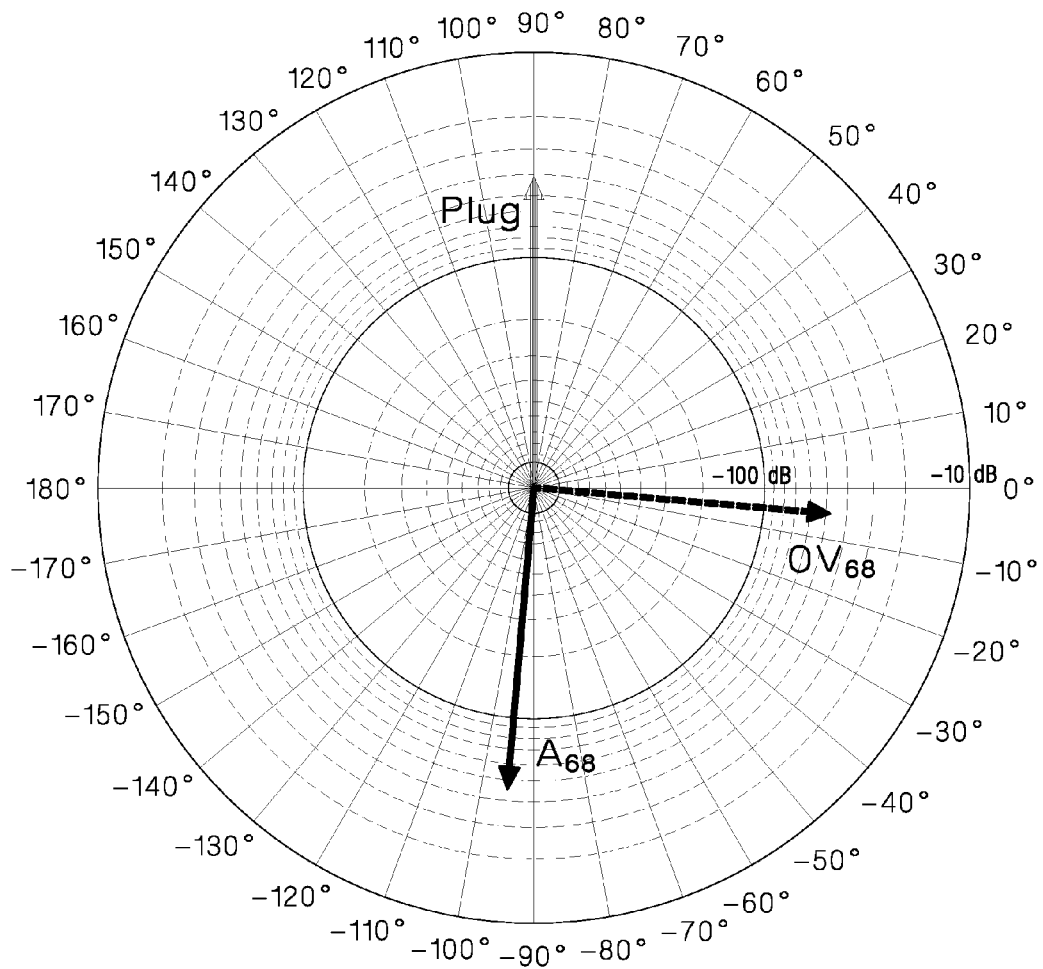
FIG. 19 illustrates a polar plot representative of the orthogonal network on the 3:6-7:8 wire pair of the printed circuit board of FIG. 15.

For wire-pair combination 3:6-7:8, the compensation network located on the PCB 26 is a type 1 orthogonal network which uses traces S6 and OCN8, and capacitor C78 to create the desired signal. FIG. 19 illustrates the resulting couplings on a representative polar plot. Traces S6 and OCN8 create capacitive coupling C68 (approximately 0.5 pF +/−20%) which produces a compensation vector "$A_{68}$" of an opposite polarity of the plug crosstalk vector "Plug." Capacitor C78 (approximately 1.3 pF +/−20%) provides a current path between traces OCN8 and S7, allowing mutual inductive coupling MOCN68 (approximately 1.4 nH +/−20%) to occur between traces S6 and OCN8. The inductive coupling MOCN68 is created by the same PCB artwork, and thus occurs in generally the same physical location, as capacitive coupling C68. In combination with the C78 capacitor, the inductive coupling MOCN68 produces a vector "$OV_{68}$" that is orthogonal to the vector "$A_{68}$" produced by the C68 capacitive coupling. The net resultant vector of couplings C68, MOCN68, and C78 provides additional NEXT bandwidth which may help to allow wire-pair combination 3:6-7:8 to meet standards for Category 6 and beyond.

A summary of the circuit elements of PCB 26 and how they generally relate to the described vectors is given in Table 1 below.

TABLE 1

Relationship of PCB 26 Circuit Elements, and "A" and "OV" Vectors:

| Pair Combination | "A" Vector | "OV" Vector Capacitor | Mutual Inductive Coupling |
|---|---|---|---|
| 4:5-3:6 | C35, C46 | C36 | MOCN35, MOCN46 |
| 3:6-1:2 | C16, C26 | C12 | MOCN16, MOCN26 |
| 3:6-7:8 | C68 | C78 | MOCN68 |
| 4:5-1:2 | N/A | N/A | N/A |
| 4:5-7:8 | N/A | N/A | N/A |
| 1:2-7:8 | N/A | N/A | N/A |

In other embodiments of the invention, the orthogonal network(s) described herein may be implemented within a communication plug (e.g., RJ45 plug). The positioning of any such orthogonal network may be similar to the previously-described embodiments in that the plug can include plug contacts instead of the jack PICs, cable connector contacts, and circuitry connecting the plug contacts to respective cable connector contacts, where the orthogonal network(s) may be implemented on said circuitry. Orthogonal networks of such embodiments may be used to generate some particular levels of crosstalk.

Note that while this invention has been described in terms of several embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. Furthermore, it should be understood that any polar or time-domain plots shown herein are not intended to be limiting of the present invention. Instead, these plots are to be understood as exemplary, illustrating the generalized representation of the performance of the present invention according to only some of the embodiments. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A communication connector, comprising:
    plug interface contacts;
    cable connector contacts; and
    a circuitry connecting said plug interface contacts to respective said cable connector contacts, said circuitry including signal conductors between respective said plug interface contacts and respective said cable connector contacts, said signal conductors including a first signal pair and a second signal pair, said circuitry including a network with a first combined mutually inductive and capacitive coupling between a first conductor of said first signal pair and a first conductor of said second signal pair, said network further including a second combined mutually inductive and capacitive coupling between a second conductor of said first signal pair and said first conductor of said second signal pair, and a shunt capacitive coupling connecting said first conductor of said first signal pair and said second conductor of said first signal pair.

2. The communication connector of claim 1, wherein said communication connector is an RJ45 jack.

3. The communication connector of claim 1, wherein said circuitry is implemented on a printed circuit board.

4. The communication connector of claim 1, wherein at least one of said first combined coupling, said second combined coupling, and said shunt capacitive coupling is formed by at least one of a discrete element, distributed coupling, and a combination thereof.

5. The communication connector of claim 1, wherein said circuitry further includes a first offshoot trace connecting said first conductor of said first signal pair and said shunt capacitive coupling, a second offshoot trace connecting said second conductor of said first signal pair and said shunt capacitive coupling, wherein said first combined mutually inductive and capacitive coupling occurs via said first offshoot trace, and said second combined mutually inductive and capacitive coupling occurs via said second offshoot trace.

6. The communication connector of claim 1, wherein said first combined mutually inductive and capacitive coupling and said second combined mutually inductive and capacitive coupling occur concurrently.

7. The communication connector of claim 1, wherein said communication connector is a communication plug.

8. A communication system, comprising:
    communication equipment; and
    a communication connector connected to said communication equipment, said communication connector including plug interface contacts, cable connector contacts, and a circuitry connecting said plug interface contacts to respective said cable connector contacts, said circuitry including signal conductors between respective said plug interface contacts and respective said cable connector contacts, said signal conductors including a first signal pair and a second signal pair, said circuitry including a network with a first combined mutually inductive and capacitive coupling between a first conductor of said first signal pair and a first conductor of said second signal pair, said network further including a second combined mutually inductive and capacitive coupling between a second conductor of said first signal pair and said first conductor of said second signal pair, and a shunt capacitive coupling connecting said first conductor of said first signal pair and said second conductor of said first signal pair.

9. The communication system of claim 8, wherein said communication connector is an RJ45 jack.

10. The communication system of claim 8, wherein said circuitry is implemented on a printed circuit board.

11. The communication system of claim 8, wherein at least one of said first combined coupling, said second combined coupling, and said shunt capacitive coupling is formed by at least one of a discrete element, distributed coupling, and a combination thereof.

12. The communication system of claim 8, wherein said circuitry further includes a first offshoot trace connecting said first conductor of said first signal pair and said shunt capacitive coupling, a second offshoot trace connecting said second conductor of said first signal pair and said shunt capacitive coupling, wherein said first combined mutually inductive and capacitive coupling occurs via said first offshoot trace, and said second combined mutually inductive and capacitive coupling occurs via said second offshoot trace.

13. The communication system of claim 8, wherein said first combined mutually inductive and capacitive coupling and said second combined mutually inductive and capacitive coupling occur concurrently.

14. A method of compensating for noise in a communication connector including a first signal pair and a second signal pair, said method comprising the steps of:
   positioning a shunt capacitive coupling between a first conductor of said first signal pair and a second conductor of said first signal pair;
   reactively crosstalk coupling said first conductor of said first signal pair and a first conductor of said second signal pair, said crosstalk coupling having a first orthogonal component;
   reactively compensation coupling said second conductor of said first signal pair and said first conductor of said second signal pair, said compensation coupling having a second orthogonal component; and
   controlling a magnitude of an orthogonal vector representing a combination of said first and second orthogonal components by adjusting said crosstalk coupling and said compensation coupling.

15. The method of claim 14, wherein said communication connector is an RJ45 jack.

16. The method of claim 14, wherein said step of reactively crosstalk coupling and said step of reactively compensation coupling occur concurrently.

17. The method of claim 14, wherein at least one of said reactively crosstalk coupling and reactively compensation coupling is achieved by providing a discrete element, distributed coupling, and a combination thereof.

18. The method of claim 14, wherein said communication connector further includes a first offshoot trace connected to said first conductor of said first signal pair and a second offshoot trace connected to said second conductor of said first signal pair,
   wherein said step of reactively crosstalk coupling said first conductor of said first signal pair and said first conductor of said second signal pair includes coupling said first conductor of said second signal pair and said first offshoot trace, and
   wherein said step of reactively compensation coupling said second conductor of said first signal pair and said first conductor of said second signal pair includes coupling said first conductor of said second signal pair and said second offshoot trace.

19. The method of claim 18, wherein said first and second orthogonal components are turned on by positioning said shunt capacitive coupling between said first and second offshoot traces.

* * * * *